(12) United States Patent
Cairns et al.

(10) Patent No.: US 6,377,104 B2
(45) Date of Patent: Apr. 23, 2002

(54) STATIC CLOCK PULSE GENERATOR AND DISPLAY

(75) Inventors: Graham Andrew Cairns; Michael James Brownlow, both of Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/819,944

(22) Filed: Mar. 28, 2001

(30) Foreign Application Priority Data

Apr. 4, 2000 (GB) ................................................ 0008080

(51) Int. Cl.⁷ ............................................... G06F 1/09
(52) U.S. Cl. ......................................... 327/291; 327/296
(58) Field of Search ............................... 327/291, 293, 327/295, 296, 297, 218

(56) References Cited

U.S. PATENT DOCUMENTS

| | | | |
|---|---|---|---|
| 4,257,108 A | * 3/1981 | Igel | 327/141 |
| 4,641,102 A | * 2/1987 | Coulthart et al. | 327/164 |
| 4,679,214 A | 7/1987 | Takemae | 377/80 |
| 5,105,187 A | 4/1992 | Plus et al. | 340/811 |
| 5,451,911 A | * 9/1995 | Colvin et al. | 327/113 |

FOREIGN PATENT DOCUMENTS

EP 0 825 584 A2 2/1998

OTHER PUBLICATIONS

Search Report, Application No. GB 0008080.4, dated May 23, 2000.

* cited by examiner

Primary Examiner—Terry D. Cunningham
Assistant Examiner—Linh Nguyen
(74) Attorney, Agent, or Firm—Renner, Otto, Boisselle & Sklar

(57) ABSTRACT

A static clock pulse generator comprises a plurality of stages 1,2, each of which comprises a D-type flip-flop 3 and a gating circuit 4. The flip-flop 3 supplies output signals Q of the stage which are also used as gating signals for the gating circuit 4 of the following stage. The gating circuit 4 supplies a signal to the data input D of the flip-flop 3 when its gating input G is active and a clock pulse is present on the clock input CK or !CK. An asynchronous reset signal R is supplied to the flip-flop 3 from the following stage.

37 Claims, 23 Drawing Sheets

STATIC CLOCK PULSE GENERATOR AND DISPLAY

BACKGROUND OF THE INVENTION

1. Field of the Invention

The present invention relates to a static clock pulse generator. Such a generator may be used in high speed low power controller circuits, for instance in complex very large scale integrated (VLSI) designs including digital signal processing (DSP). The clock pulse generator may advantageously be used in addressing for driver circuits of spatial light modulators and displays, for example of the pixelated matrix type in which a sequence of well-defined pulses must be supplied to circuits which sample high speed video data.

2. Description of the Related Art

A known type of clock pulse generator is based on a shift register. The shift register comprises a cascaded chain of D-type flip-flops which respond to clock pulses to pass a single stored logic state from one flip-flop to the next in the chain, for example as disclosed in Horowitz and Hill, "The Art of Electronics", Cambridge University Press, $2^{nd}$ Edition, 1989. For a typical clock pulse generation application, all but one of the states of the flip-flops are initialised to a logic low (0) state whereas the remaining flip-flop is initialised to a logic high (1) state. The shift register is clocked at a known frequency and the circulating 1 state within the shift register is used to generate sequential pulses at the outputs of the flip-flops. Applications and embodiments of this well-known technique are disclosed, for example, in U.S. Pat. No. 4,542,301 and U.S. Pat. No. 4,612,659. An improvement to this technique is disclosed in U.S. Pat. No. 4,785,297. In this case, the "master" and "slave" outputs of the edge-triggered flip-flops are used in conjunction with combinational logic gates, such as AND or NAND gates, to reduce the clocking speed of the shift register for a given number of output pulses.

FIG. 1 of the accompanying drawings illustrates part of a typical CMOS circuit comprising D-type latches 1 and 2. The construction and operation of such an arrangement is well-known and will not be described in detail. Consecutive latches such as 1 and 2 are transparent on opposite clock phases of a two phase clock represented by CK and !CK. The input and output of each latch are "NANDed" together in order to produce the clock pulses Nn and Np.

Various techniques have been disclosed for reducing the capacitive loading of the clock line or lines so as to increase the maximum frequency of operation and reduce clock power consumption. For example, state-controlled clocking techniques have been suggested for use in clock pulse generating circuits. An example of this is disclosed in U.S. Pat. No. 4,746,915, in which the shift register is divided into several sub-registers of flip-flops or latches and another shift register operating at a lower frequency is used selectively to apply the clock signal to each sub-register.

For applications in which the requirement is for a single circulating 1 state, only those flip-flops or latches containing a 1 state or having a 1 state at their input require clocking. As shown in FIG. 2, for such applications, the signal generated by "ORing" the input and output of each flip-flop can be used to gate the clock signals supplied to the clock input of the flip-flop. Such an arrangement is disclosed in U.S. Pat. No. 5,128,974. However, such an arrangement requires several further transistors per stage. Also, the flip-flop outputs have to drive a relatively large load and this limits the maximum speed of operation.

SUMMARY OF THE INVENTION

The term "D-type latch" as used herein refers to a circuit which has a clock input, a data input and a direct or inverted output and which operates such that, when the clock signal supplied to the clock input is active, the output suppleis a direct or inverted version of the signal at the input (the latch is "transparent") whereas, when the clock signal is inactive, the output is held or "latched" at its current value irrespective of the state of the input signal. The term "D-type flip-flop" as used herein refers to an edge-triggered device which is generally formed of two cascaded D-type latches, possibly including additional circuitry. D-type latches and D-type flip-flops are referred to collectively herein as "D-type circuits" so that a D-type circuit may be a D-type latch or a D-type flip-flop.

According to a first aspect of the invention, there is provided a static clock pulse generator comprising a main clock input and N stages, each ith one of which comprises: a D-type circuit having a reset input for receiving a reset signal from an (i+a)th stage, where a is greater than or equal to one, and a data input; and a gating circuit having an output for supplying a pulse to the data input in response to a D-type circuit output signal of an (i−1)th stage and a clock pulse at the main clock input, where $1<i\leq(N-a)$.

Each D-type circuit may be a D-type latch.

Each of at least one of the stages may have an output for supplying the D-type circuit output signal and constituting an output of the generator.

The reset input of the D-type circuit of each ith stage may be arranged to receive the reset signal from the output of the gating circuit of the (i+a)th stage.

The reset input of the D-type circuit of each ith stage may be arranged to receive the D-type circuit output signal of the (i+a)th stage as the reset signal.

Each stage may comprise a delay circuit disposed between the gating circuit output and the D-type circuit data input of each stage. Each delay circuit may comprise a plurality of cascade-connected inverters.

Each stage may comprise 4 switching arrangement for selectively-connecting the D-type circuit reset input to receive the reset signal from the (i−a)th stage and causing the gating circuit to supply the pulse to the data input in response to the D-type circuit output signal of the (i+1)th stage and the clock pulse at the main clock input, where $(1+a)\leq i<N$. Each switching arrangement may comprise a plurality of transmission gates.

The D-type circuit of each ith stage may comprise a clock input for receiving the D-type circuit output signal of the (i−1)th stage.

The switching arrangement may be arranged selectively to connect the D-type circuit clock input of each ith stage to receive the D-type circuit output signal of the (i+1)th stage.

The first stage may comprise: a D-type circuit having a reset input, for receiving a reset signal from a (1+a)th stage, and a data input; and a gating circuit for supplying a pulse to the D-type circuit data input in response to a start pulse and a clock pulse at the main clock input.

The switching arrangement may be arranged selectively to connect the reset signal from the first stage to the D-type circuit reset input of the first stage.

The Nth stage may comprise: a D-type circuit having a data input, an output and a reset input for receiving a reset signal from the D-type circuit output; and a gating circuit having an output for supplying a pulse to the data input in response to the D-type circuit output signal of the (N−1)th stage and a clock pulse at the main clock input.

The main clock input may comprise a complementary clock input and the gating circuits of consecutive pairs of stages may be arranged to respond to complementary clock pulses at the complementary inputs. Each gating circuit may comprise a first transistor whose common electrode is connected to the main clock input, whose output electrode forms an enabled data input of the D-type circuit and whose control electrode is responsive to the D-type circuit output signal of the preceding stage. Each gating circuit may comprise a second transistor whose common electrode is connected to a first supply line and whose output electrode is connected to the output electrode of the first transistor. The control electrode of the second transistor may be arranged to receive the D-type circuit output signal of the preceding stage.

The control electrode of the first transistor may be connected to a bias voltage source which is arranged to be controlled by the D-type circuit output signal of the preceding stage. The bias voltage source may comprise a third transistor whose common electrode is connected to an inverted main clock input and whose control and output electrodes are connected to the control electrode of the first transistor. The control electrode of the first transistor may be connected to the output electrode of a fourth transistor whose common electrode is connected to a or the first supply line. The control electrode of the fourth transistor may be arranged to receive the D-type circuit output signal of the preceding stage.

The control electrode of the first transistor may be connected to the output electrode of a fifth transistor whose common electrode is connected to a second supply line and whose control electrode is arranged to receive the D-type circuit output signal of the preceding stage.

Each D-type latch may comprise a first inverter and a second feedback inverter. The second inverter may be a gated inverter having a gate input arranged to be controlled by the D-type latch output signal of the preceding stage.

The first inverter may be connected to a pull-up or pull-down transistor whose control terminal comprises the reset input.

The generator may be formed as a CMOS integrated circuit.

The generator may be formed of poly-silicon transistors.

According to a second aspect of the invention, there is provided a spatial light modulator comprising a generator according to the first aspect of the invention.

The modulator may comprise a liquid crystal device.

The liquid crystal device may be of passive matrix type.

The liquid crystal device may be of active matrix type. The generator and the active matrix may be formed of thin film transistors of the same type.

According to a third aspect of the invention, there is provided a display comprising a modulator according to the second aspect of the invention.

According to a fourth aspect of the invention there is provided a light-emissive display comprising a generator according to the first aspect of the invention.

The display may be of the passive or active matrix type.

It is thus possible to provide a clock pulse generator which is capable of high speed operation and low power consumption. Such a generator provides static operation with no momentarily-floating circuit nodes and imposes a low load on input clock signals. The generator may easily be arranged to operate in a bi-direction mode and may be constructed with a relatively low number of transistors. The generator may also operate with low voltage input clock signals and is able to provide level shifting from, for example, clock signals having an amplitude of two volts or less to output signals which switch between the power supply lines, typically carrying a supply voltage of ten to twenty volts. Such performance may be achieved using poly-silicon thin film transistor technology.

BRIEF DESCRIPTION OF THE DRAWINGS

The invention will be further described, by way of example, with reference to the accompanying drawings, in which.

Like reference numerals refer to like parts of throughout the drawings.

DESCRIPTION OF THE PREFERRED EMBODIMENTS

Figure 3:
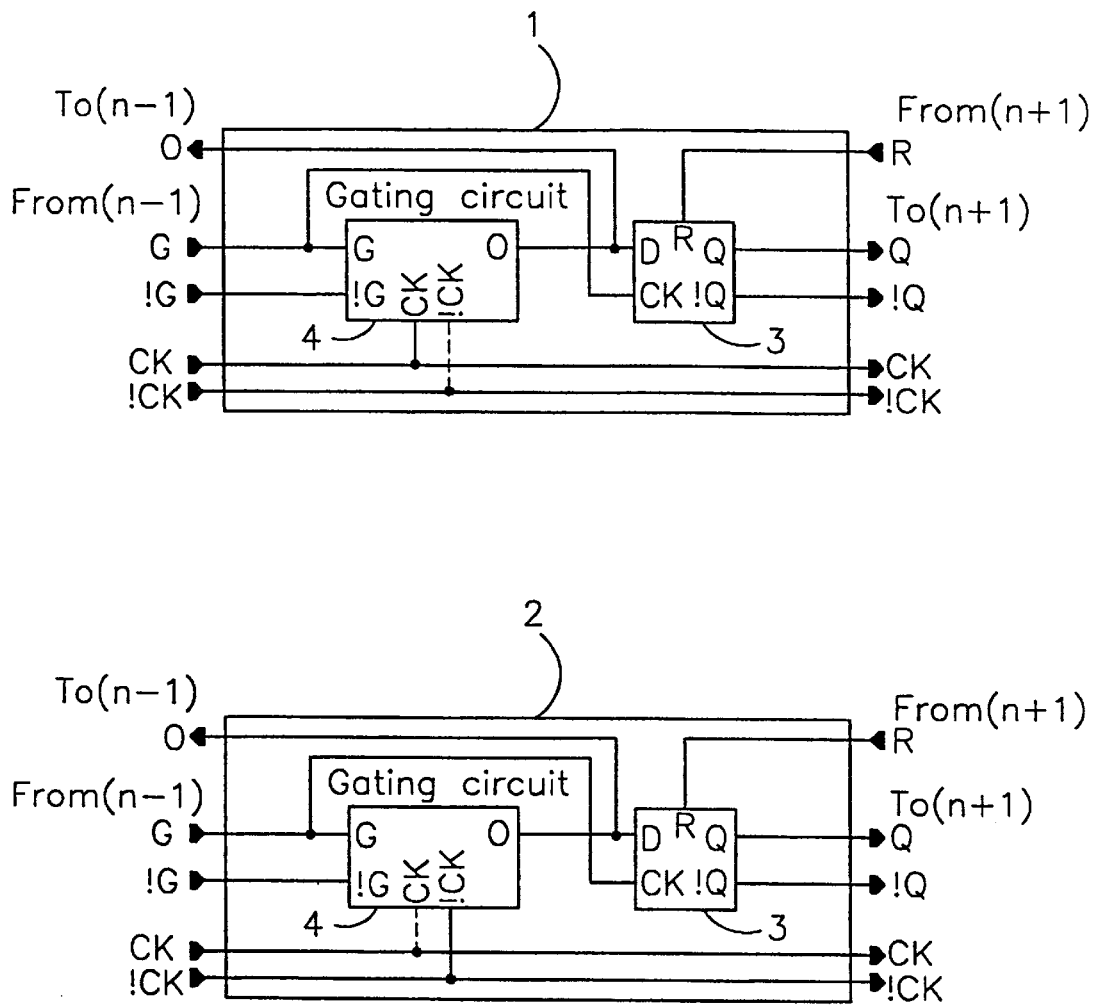
FIG. 3 is a circuit diagram of two stages of a static clock pulse generator constituting an embodiment of the invention.

FIG. 3 shows two stages 1 and 2 of a static clock pulse generator. The stage 1 comprises a D-type latch 3 and a gating circuit 4. The latch 3 has direct and inverted outputs Q and !Q which are connected to the following stage, the output Q constituting the output of the stage and an output of the clock pulse generator. The latch has an asynchronous reset input R which receives a reset signal from the following stage.

The gating circuit 4 has complementary clock inputs CK and !CK which are connected to a main clock input via clock lines which are common to all of the stages. The clock input CK of the gating circuit 4 of the stage 1 is connected to the clock line CK. The inverted clock input !CK is shown connected to the corresponding clock line by a broken line in FIG. 3 because this connection may not be required in some embodiments.

The gating circuit 4 has complementary gating inputs G and !G which receive gating signals from the preceding stage. In some embodiments, only the direct or inverted gating signal may be passed from stage to stage. The gating input G is also connected to a clock input CK of the latch 3. The gating circuit 4 has an output O which supplies a reset signal to the preceding stage and which Is also connected to a data input D of the latch 3.

The stage 1 is activated by the direct clock pulses CK whereas the stage 2 is activated by the inverted clock pulses !CK (for convenience, the signals appearing on the various circuit lines and nodes are referred to by the same reference numerals as the circuit lines and nodes). Thus, the input !CK of the gating circuit 4 is connected to the inverted clock line whereas the direct clock input CK may or may not be connected to the corresponding direct clock line depending on the requirements of the particular embodiment.

Figure 4:
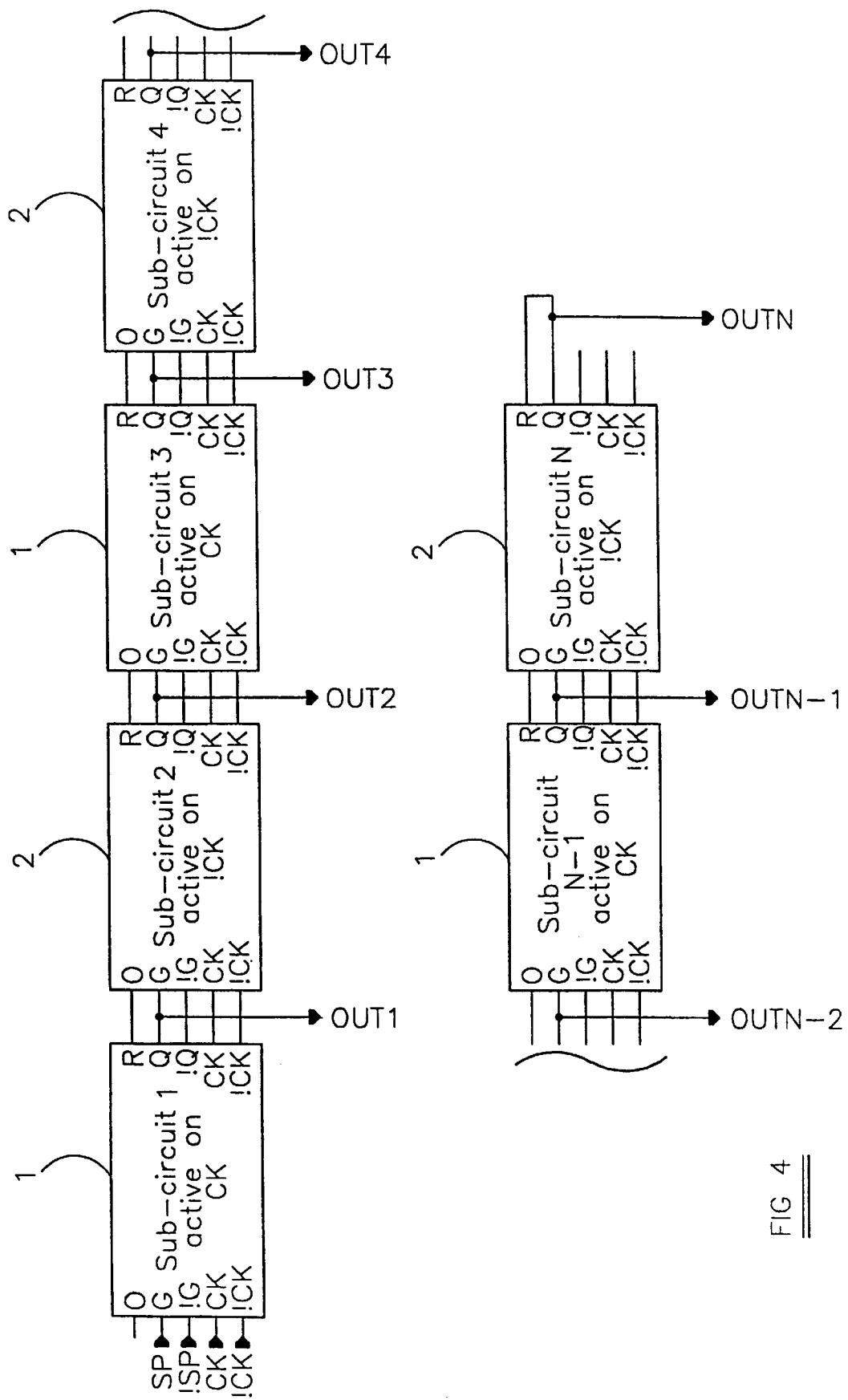
FIG. 4 is a block diagram of the clock pulse generator whose stages are shown in FIG. 3.

FIG. 4 shows part of a static clock pulse generator which comprises N stages 1,2 connected in cascade. The stages 1 alternate with the stages 2. The complementary gating inputs G and !G of the first stage 1 are arranged to receive complementary start pulses SP and !SP whereas the clock inputs receive complementary clock signals CK and !CK from a two phase clock input. The reset input R of each stage 1,2 is connected to the gating circuit output O of the following stage with the exception of the last or Nth stage, whose reset input R is connected to the output Q of the same stage.

Figure 5:
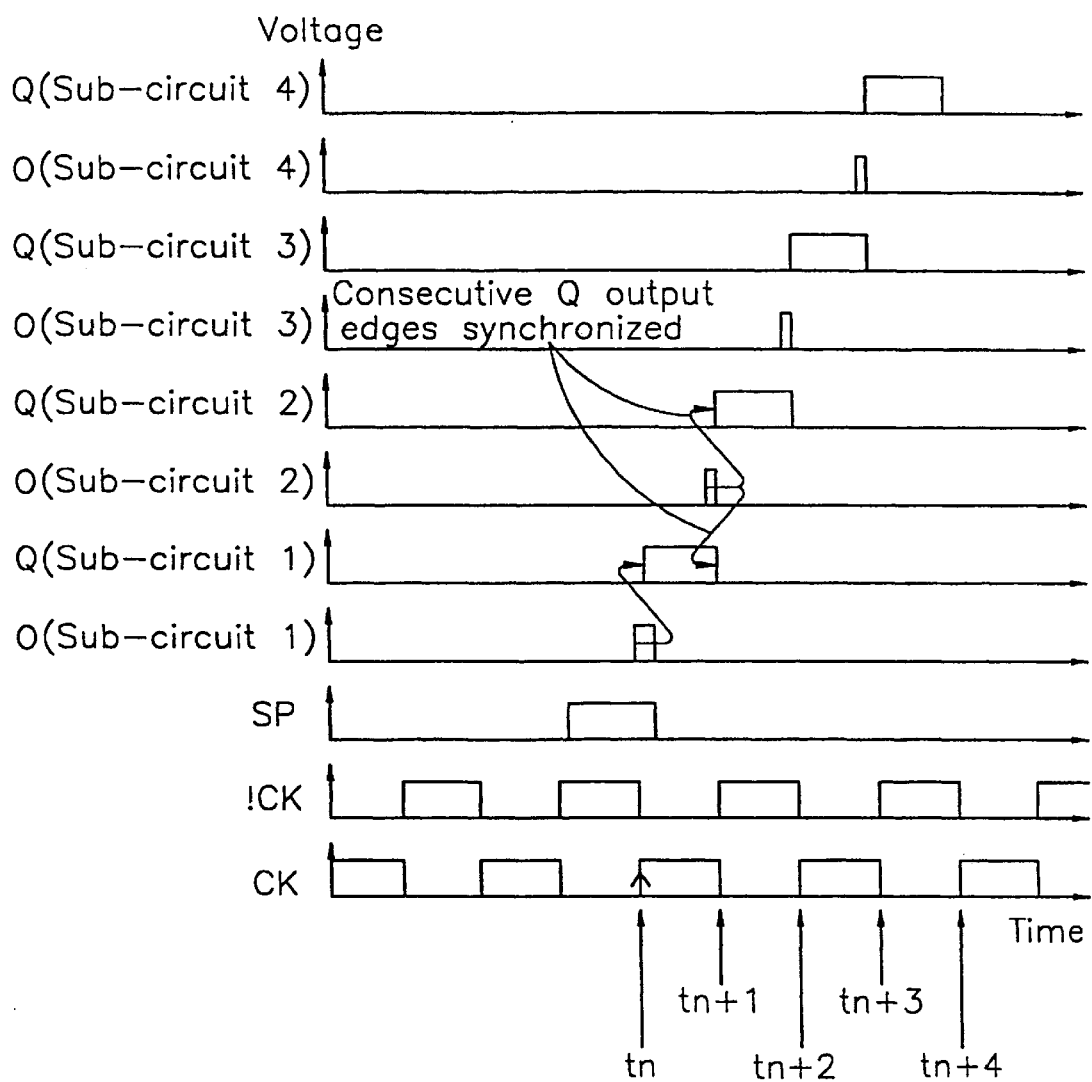
FIG. 5 is a timing diagram illustrating waveforms occurring in the clock pulse generator shown in FIGS. 3 and 4.

Operation of the static clock pulse generator is illustrated by the timing diagram of FIG. 5, which illustrates various waveforms occurring in the first four stages of the generator of FIG. 4. Initially, the latches 3 of all of the stages 1 and 2 are in a reset state so that all of the outputs Q are low. The gating circuits 4 of all of the stages 1,2 are disabled and the gating circuit outputs O are all low.

Prior to time $t_n$, a start pulse SP is supplied to the gating circuit input of the first stage. The gating circuit 4 is thus enabled and the output O of the gating circuit 4 is able to follow the logic state of the clock signal CK, possibly with level shifting of the actual logic level.

At time $t_n$, the output O of the gating circuit 4 follows the rising edge of the clock signal CK and goes high. The direct output O of the latch 3 thus goes high and enables the gating circuit 4 of the following stage 2.

Just after time $t_n$, the start pulse SP goes low so that the gating circuit 1 of the first stage is disabled. The clock input CK of the latch also goes low so that the latch remains in its state with the output Q high until a reset signal is received.

At time $t_n+1$, the output O of the gating circuit 4 of the second stage 2 follows the rising edge of the inverted clock signal !CK and goes high. The output Q of the latch 3 of the second stage also goes high and enables the gating circuit 4 of the third stage. simultaneously, the output O of the gating circuit 4 of the second stage supplies a reset signal to the reset input R of the latch of the first stage, whose output Q thus goes low. The falling and rising edges of the outputs Q of consecutive stages are thus coincident or synchronised as illustrated in FIG. 5.

At time $t_n+2$, the output O of the gating circuit 4 of the third stage follows the rising edge of the clock signal CK and goes high. The output Q of the third stage thus goes high and enables the gating circuit 4 of the fourth stage. Simultaneously, the latch 3 of the second stage is reset. Operation then continues as described hereinbefore with each latch 3 being set once by a gated clock pulse input and reset once by a feedback signal from the next or following stage of the generator.

Figure 6:
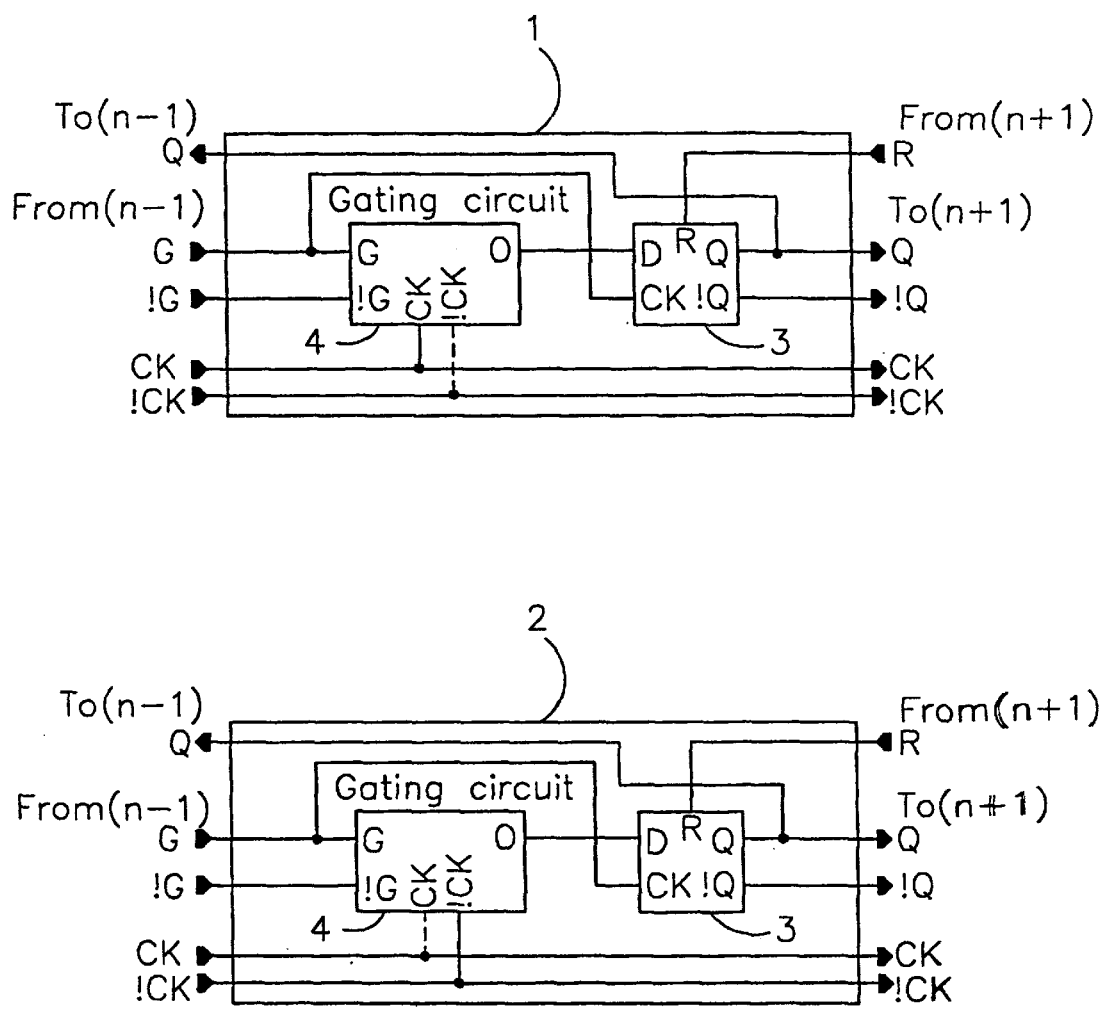
FIG. 6 is a circuit diagram of two stages of a static clock pulse generator constituting an embodiment of the invention.
Figure 7:
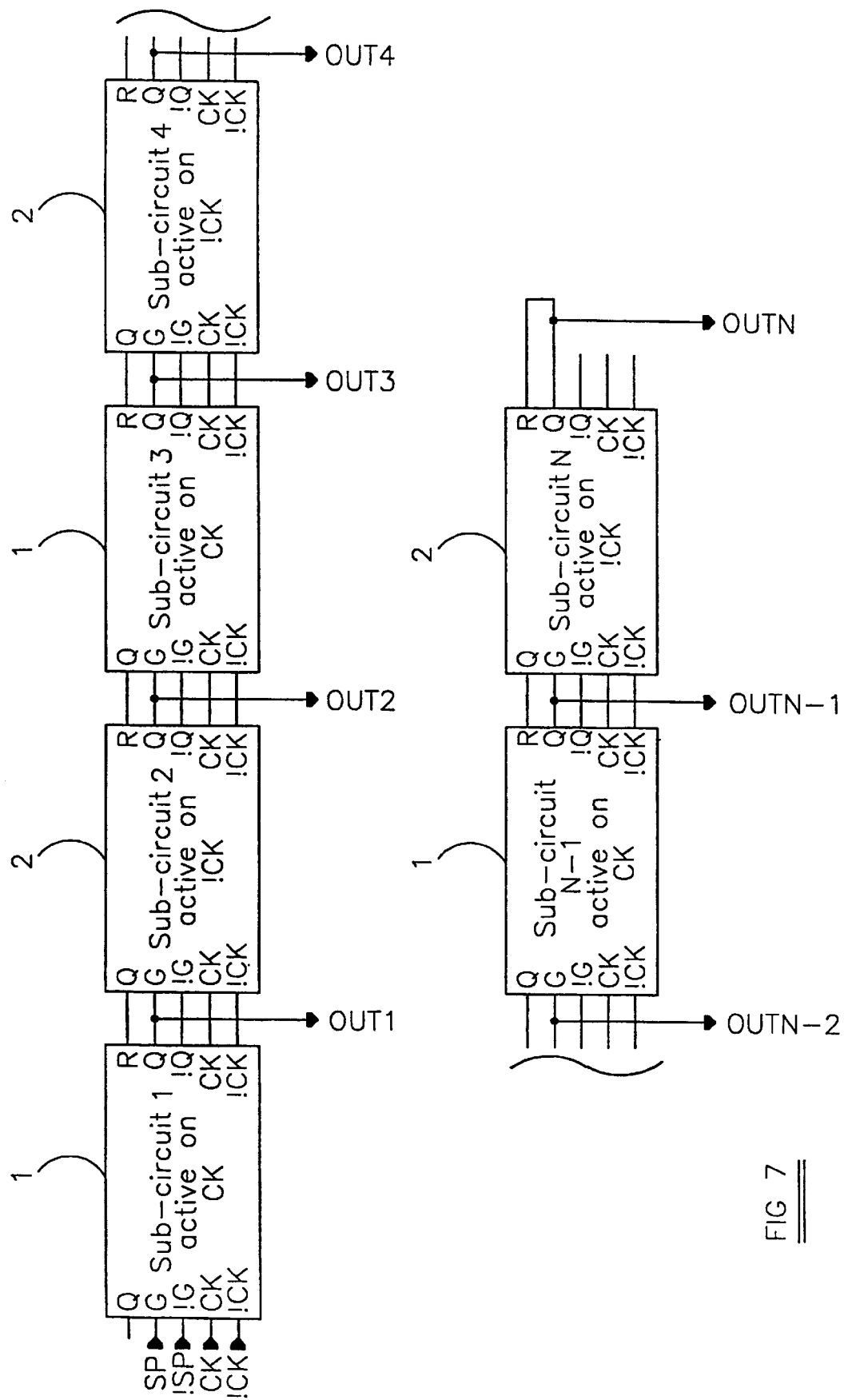
FIG. 7 is a block diagram of the clock pulse generator whose stages are shown in FIG. 6.

The stages 1 and 2 shown in FIG. 6 differ from those shown in FIG. 3 in that the reset signal for each preceding stage is supplied by the output Q of the latch 3 instead of by the output o of the gating circuit 4. The generator shown in FIG. 7 and comprising the stages 1 and 2 differs from the generator shown in FIG. 4 only in the labelling of the stage outputs for the reset signals.

Figure 8:
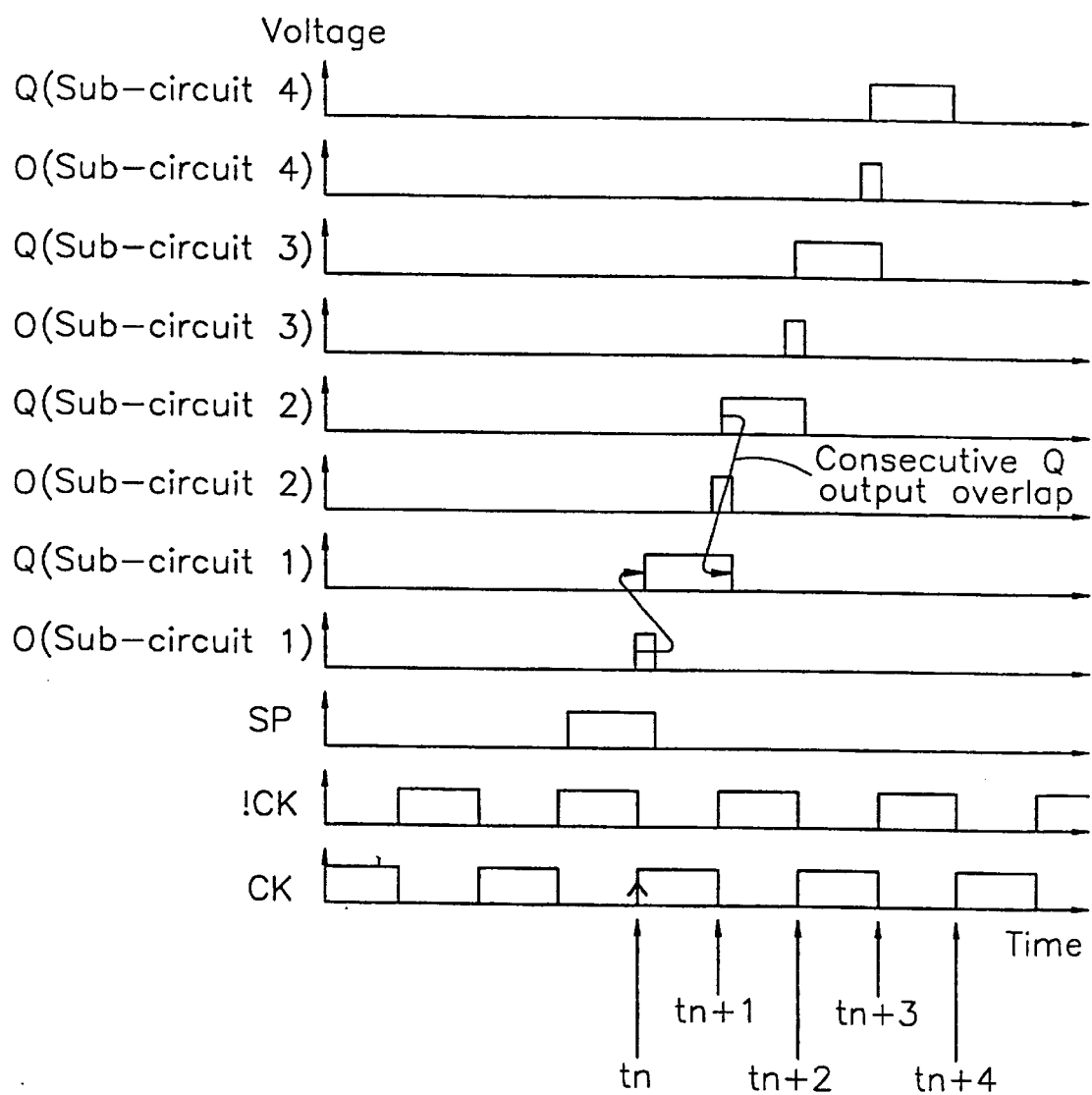
FIG. 8 is a timing diagram illustrating waveforms occurring in the clock pulse generator shown in FIGS. 6 and 7.

FIG. 8 illustrates the resulting waveforms. Because each latch 3 is not reset until the latch 3 of the following stage in set, all of the stage outputs Q are guaranteed to overlap as illustrated in FIG. 8. Such an arrangement is therefore suitable for clock pulse generators which are required to provide consecutive overlapping signals.

Figure 9:
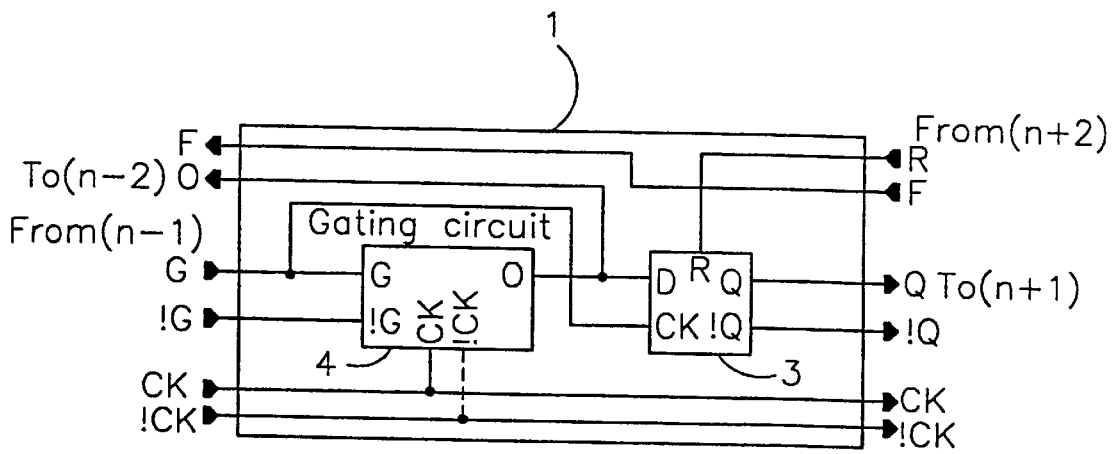
FIG. 9 is a circuit diagram of two stages of a static clock pulse generator constituting an embodiment of the invention.
Figure 9:
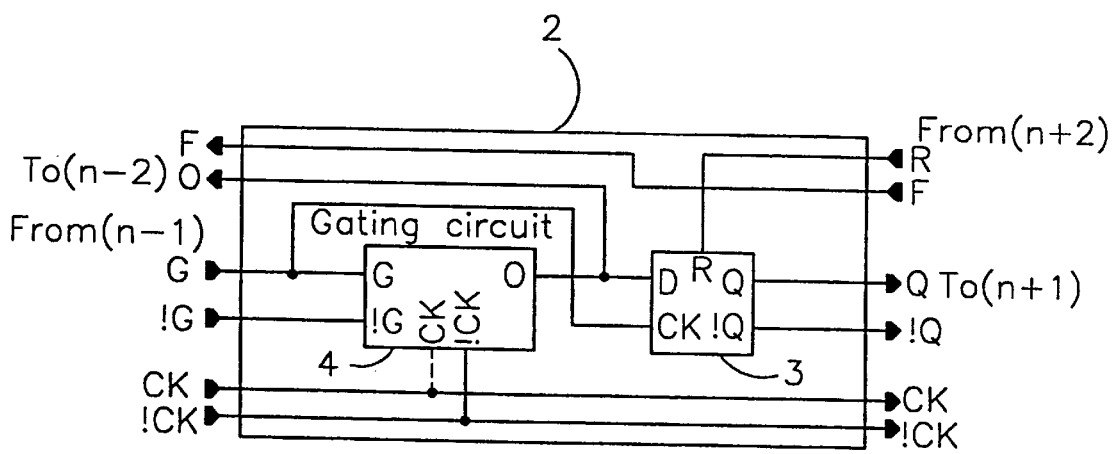
Figure 10:
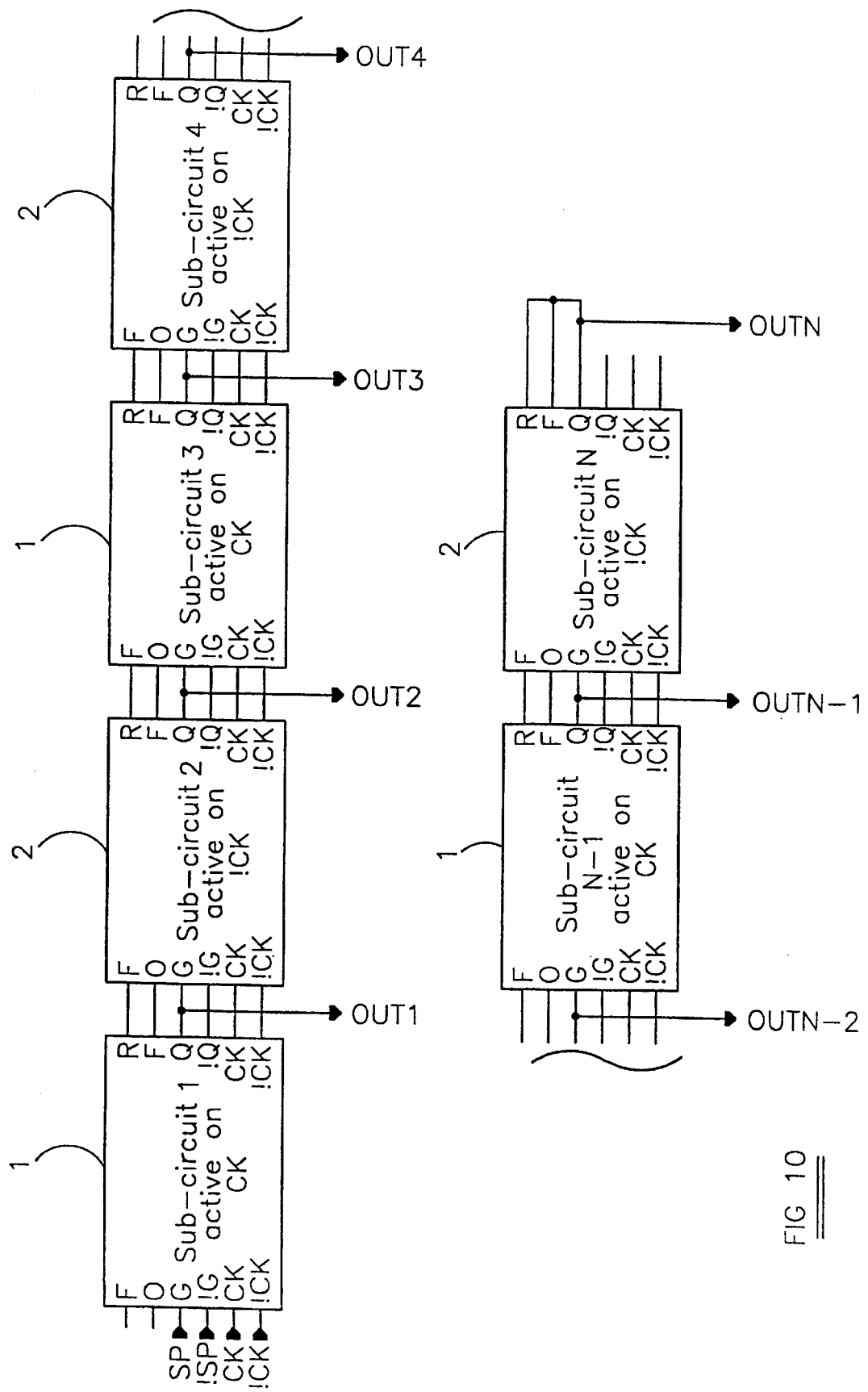
FIG. 10 is a block diagram of the clock pulse generator whose stages are shown in FIG. 9.

The stages 1 and 2 shown in FIG. 9 differ from those shown in FIG. 3 in that the latch reset signal for each stage is derived from the next-but-one following stage i.e. for each nth stage, the reset signal is fedback from the (n+2)th stage. In addition, each stage 1,2 has an input F connected by a feed-through line to an output F for passing reset signals from the following stage to the preceding stage. The interconnections of the stages are illustrated in FIG. 10. The output Q of the Nth stage is connected to the feedback input F and to the reset input R of the same stage.

Figure 11:
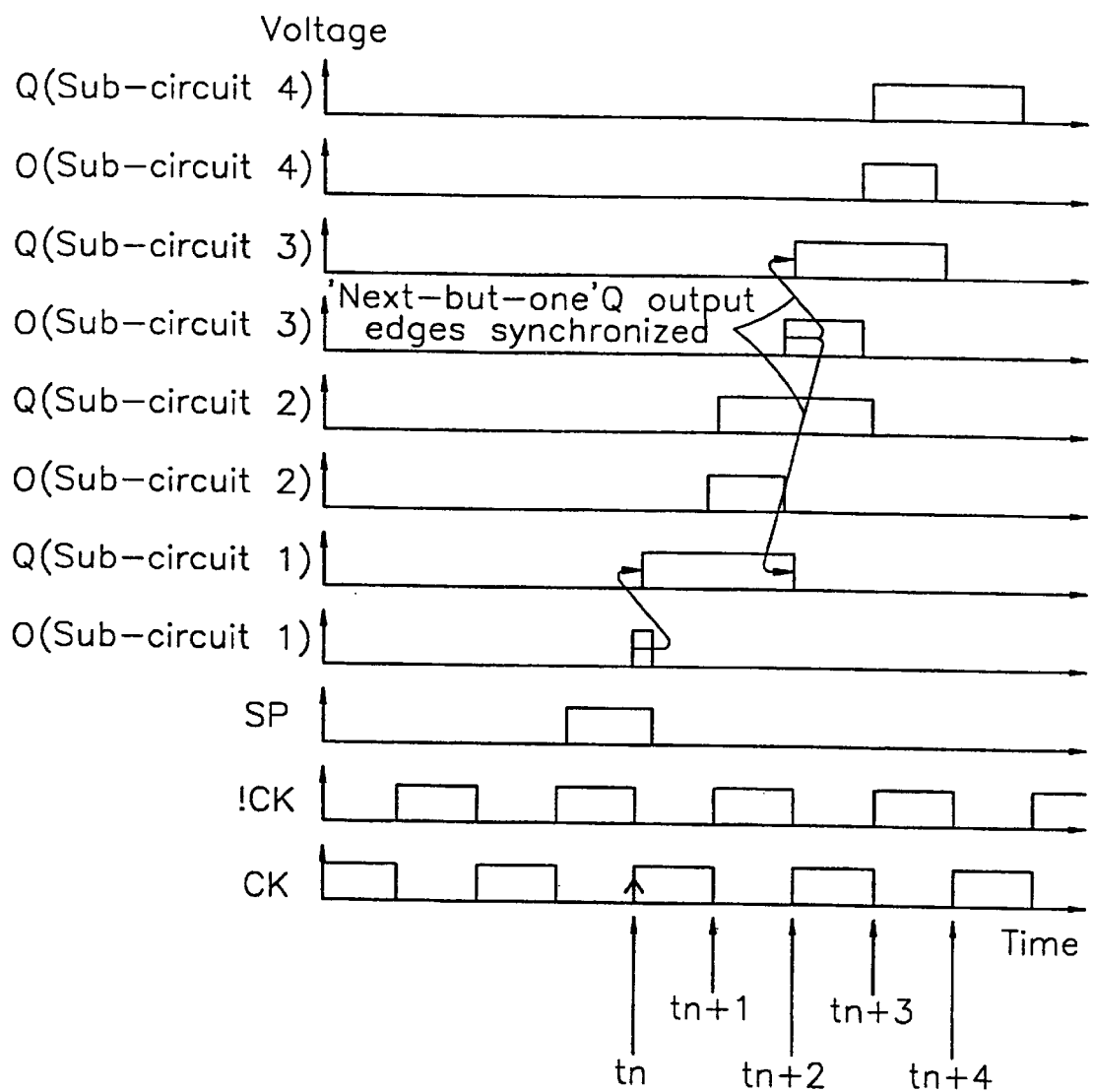
FIG. 11 is a timing diagram illustrating waveforms occurring in the clock pulse generator shown in FIGS. 8 and 9.

As illustrated in FIG. 11, the consecutive outputs Q are active or high for an entire clock period of the clock signals CK, !CK so that the falling and rising edges of every other output Q are coincident. Consecutive pairs of output signals Q overlap by substantially half the clock period.

Figure 12:
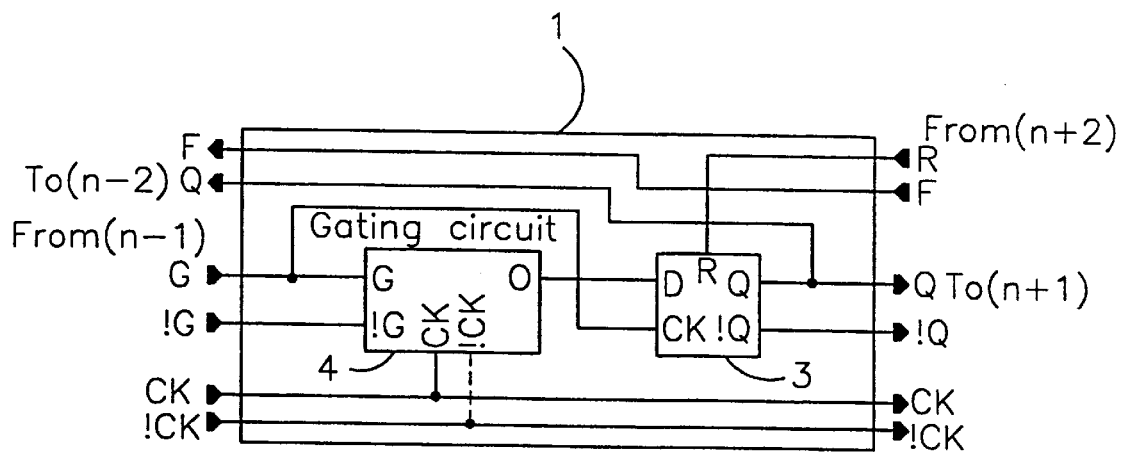
FIG. 12 is a circuit diagram of two stages of a static clock pulse generator constituting an embodiment of the invention.
Figure 12:
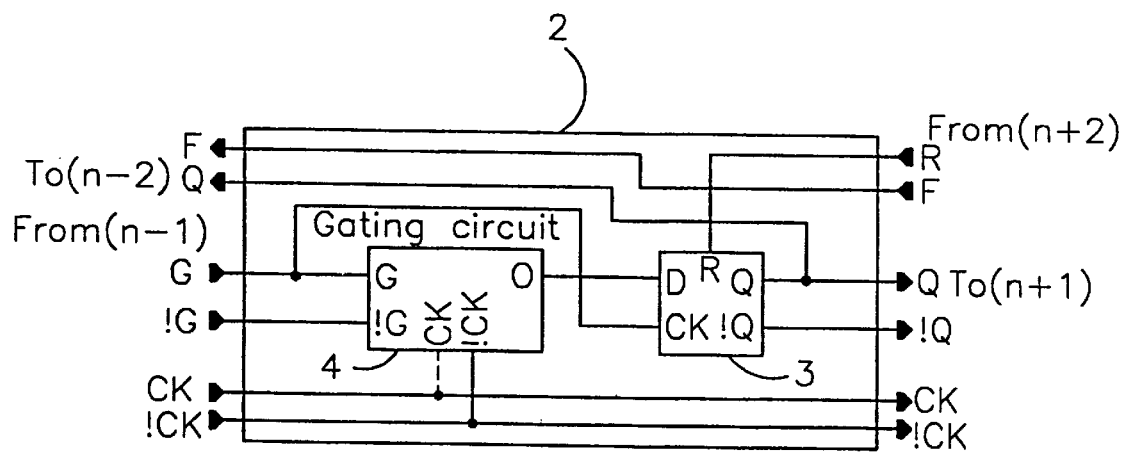
Figure 13:
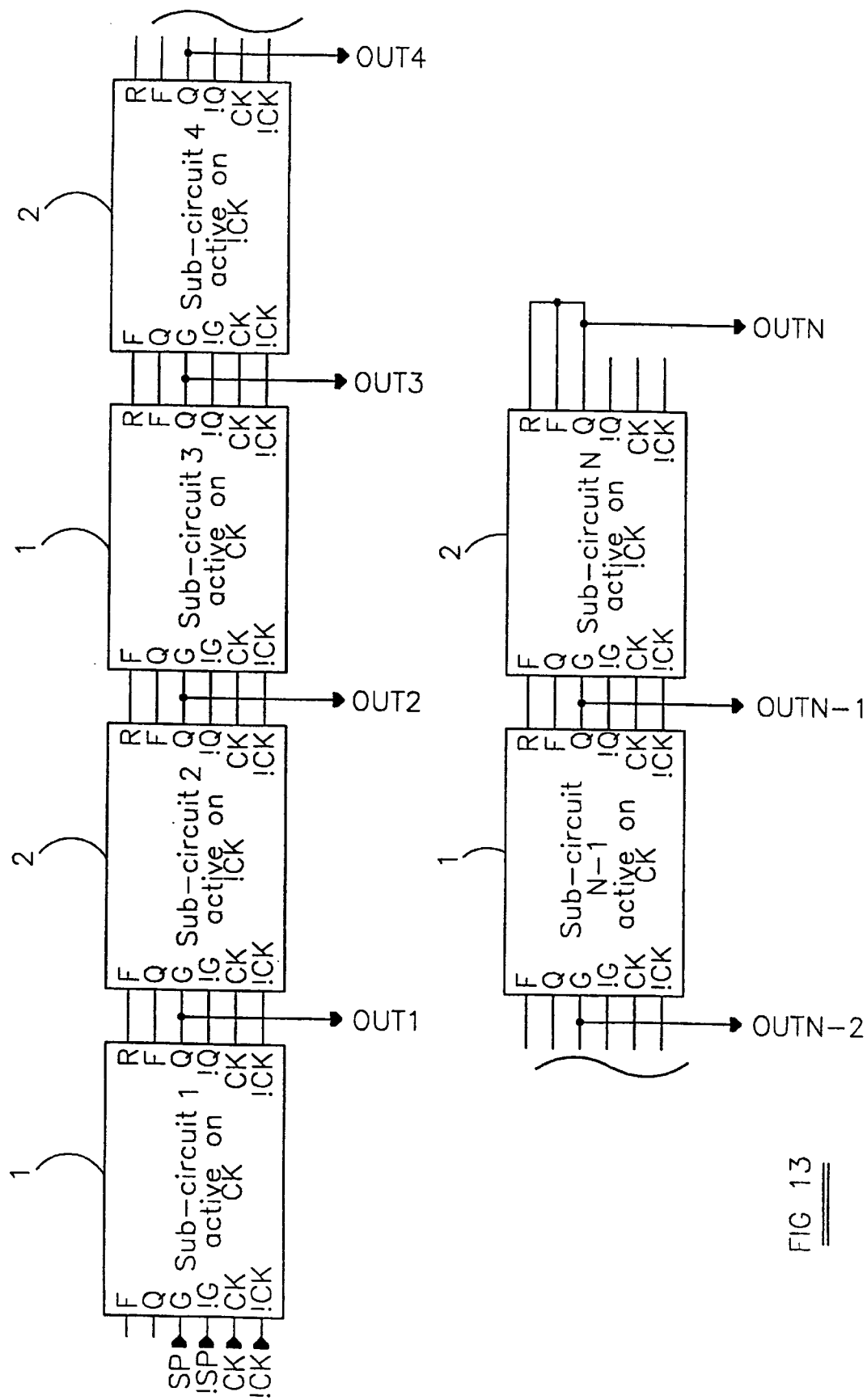
FIG. 13 is a block diagram of the clock pulse generator whose stages are shown in FIG. 12.
Figure 14:
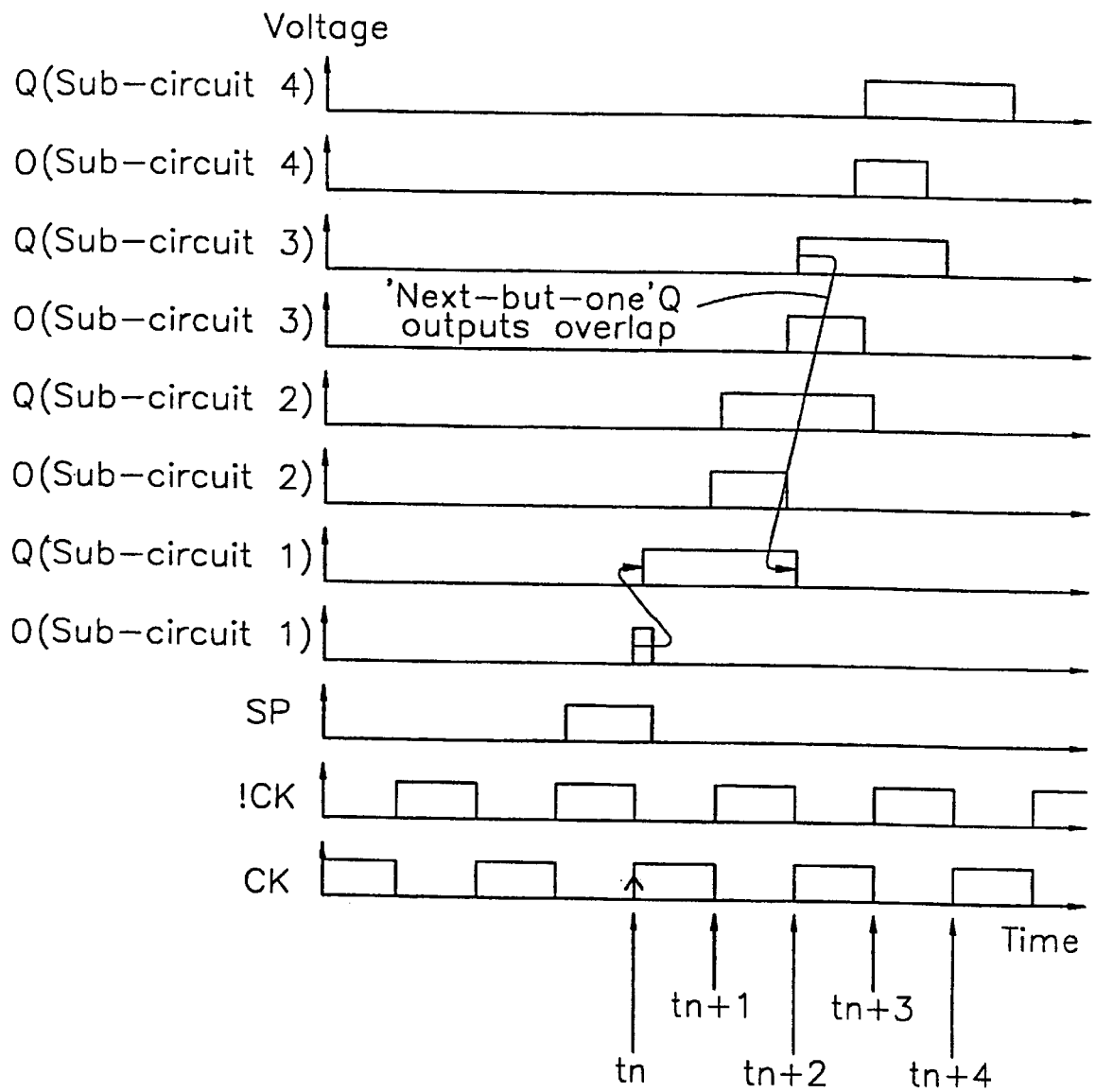
FIG. 14 is a timing diagram illustrating waveforms occurring in the clock pulse generator shown in FIGS. 12 and 13.

The stages 1 and 2 shown in FIG. 12 differ from those shown in FIG. 9 in that, as in the case of the arrangement of FIG. 6, the reset signals are derived from the output Q of the latch of each stage. The interconnections between the stages of the generator are illustrated in FIG. 13 and differ from those illustrated in FIG. 10 only in the labelling of the reset pulse feedback output of each stage. As illustrated in FIG. 14, because each latch 3 in not reset until the latch 3 of the next-but-one stage is set, the outputs Q of every other stage are guaranteed to overlap.

Figure 15:
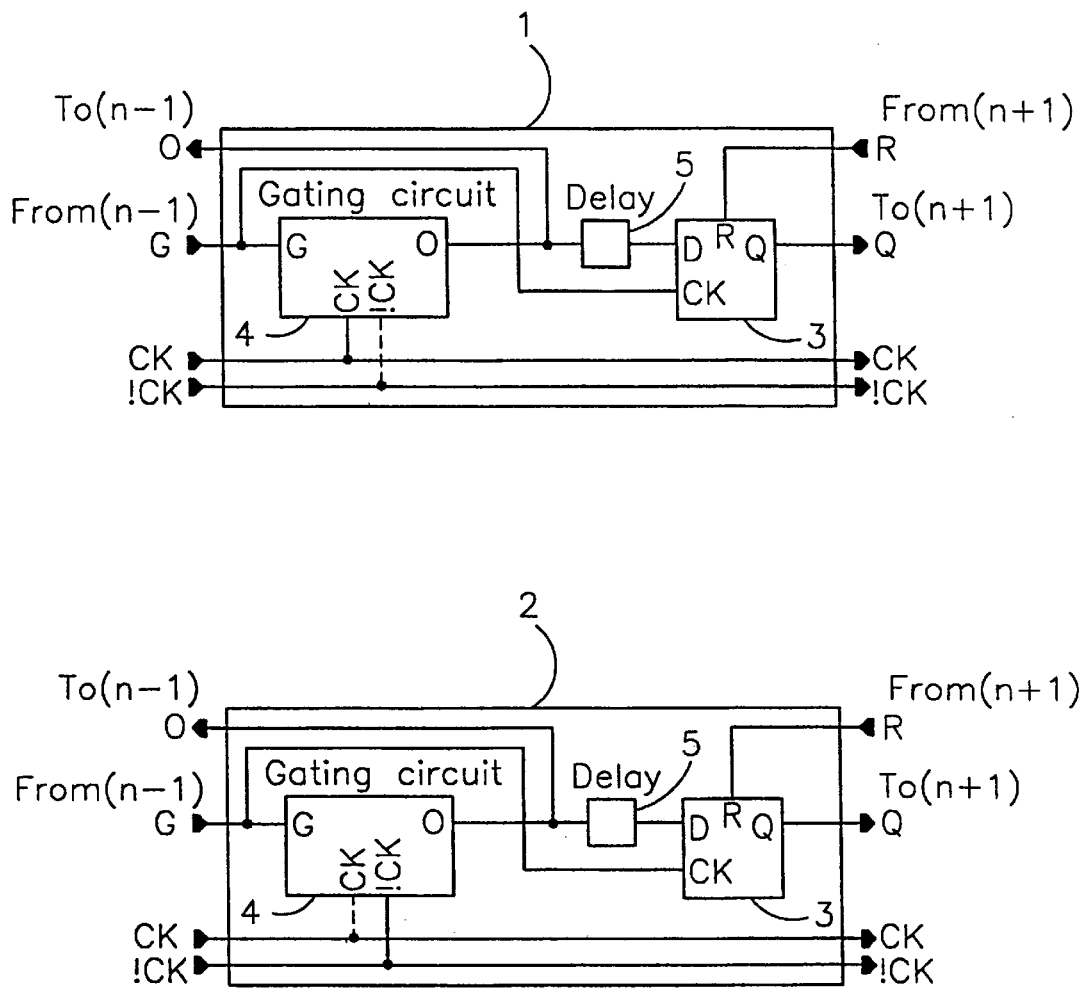
FIG. 15 is a circuit diagram of two stages of a static clock pulse generator constituting an embodiment of the invention.

The stages 1 and 2 of FIG. 15 differ from those of FIG. 3 in that each comprises a delay element or circuit 5 connected between the output O of the gating circuit 4 and the data input D of the latch 3 with the reset signal for the preceding stage being derived directly from the output O of the gating circuit 4. The interconnections of the stages are as illustrated in FIG. 4. Each delay circuit 5 may, for example, comprise a plurality of cascade-connected inverters. Unless an inverted signal is required by the latch 3, there should be an even number of inverters connected in cascade.

Figure 16:
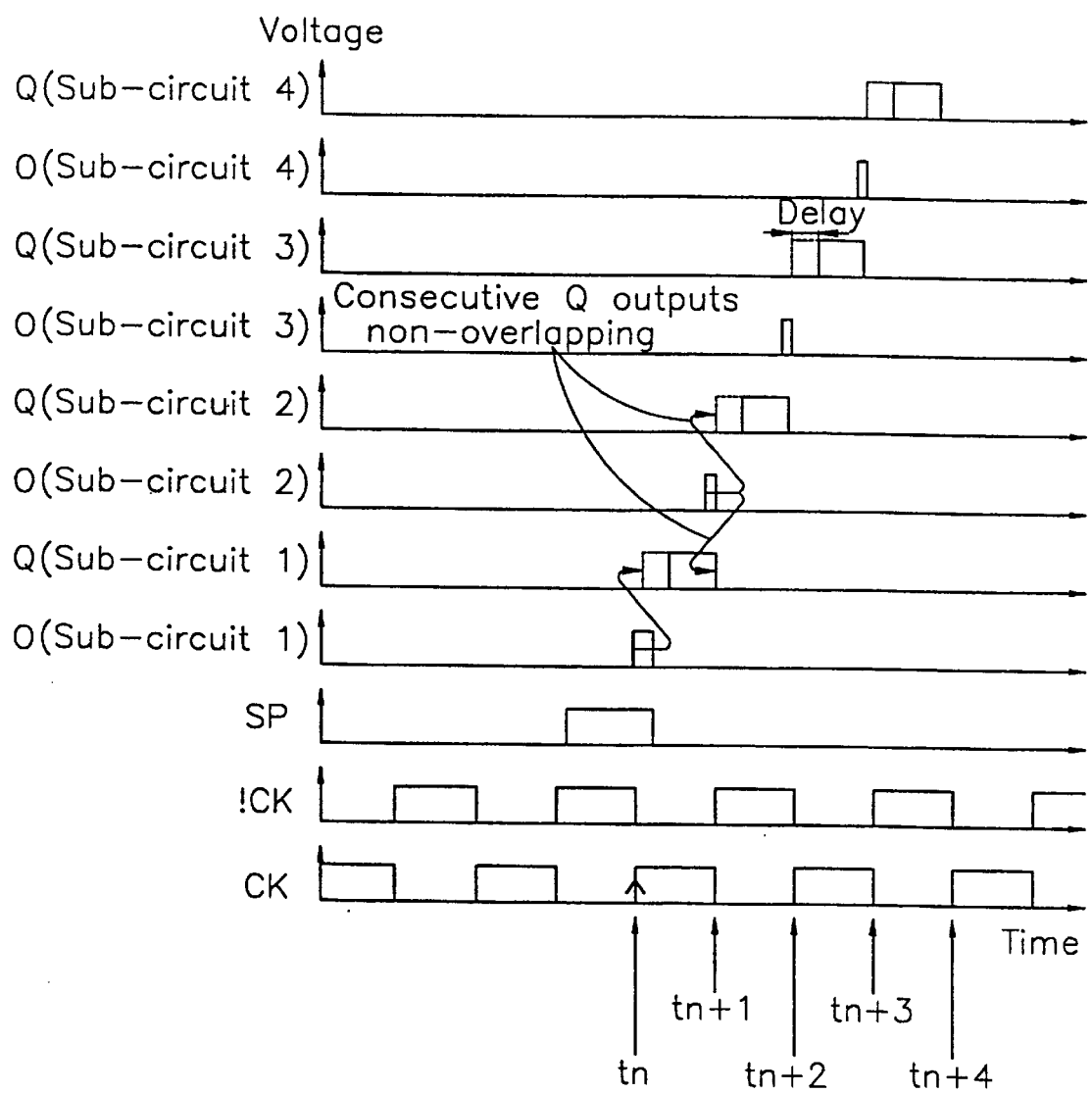
FIG. 16 is a timing diagram illustrating waveforms occurring in the clock pulse generator shown in FIG. 15.

As illustrated in FIG. 16, the delay provided by the delay circuit 5 of each stage ensures that the latch 3 of the preceding stage is reset before the latch 3 of the current stage is set. This in turn ensures that the outputs Q of consecutive stages are non-overlapping, as may be required for some applications of the clock pulse generator.

Figure 17:
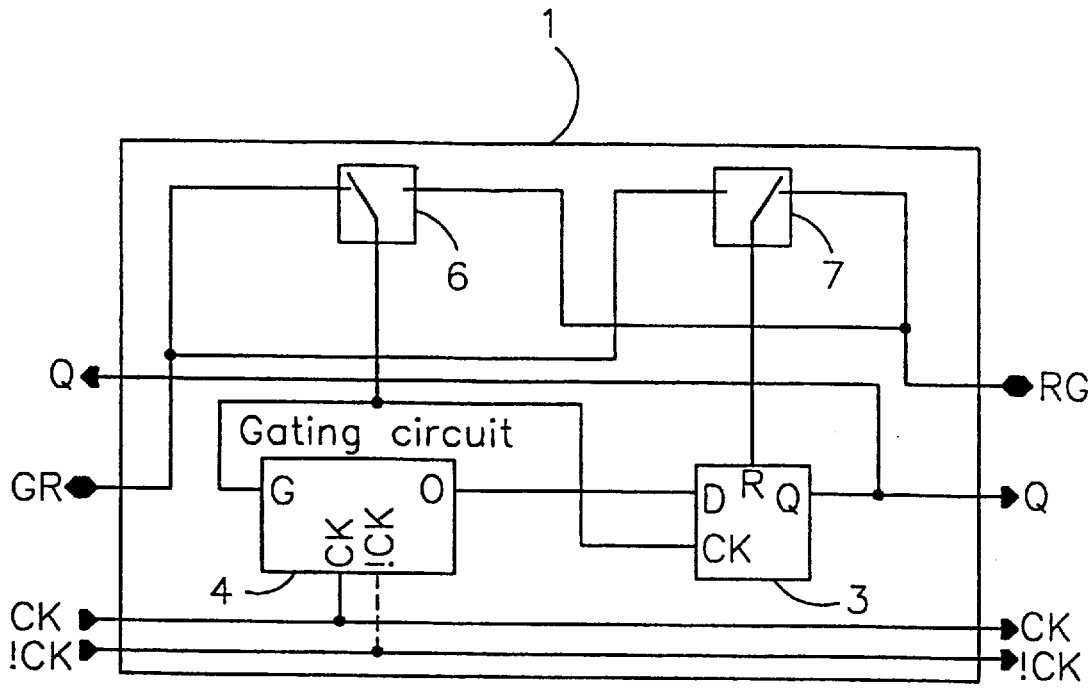
FIG. 17 is a circuit diagram of one stage of a bi-directional static clock pulse generator constituting an embodiment of the invention and illustrates operation in both directions.
Figure 17:
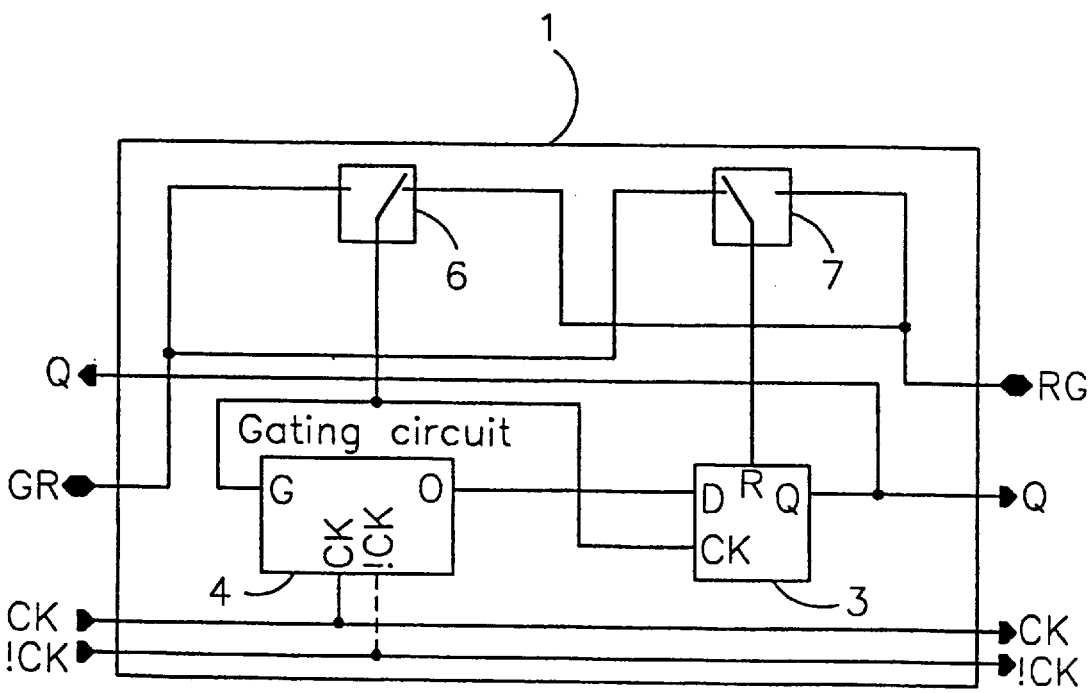

FIG. 17 illustrates a stage 1 of the type shown in FIG. 6 arranged for bidirectional operation i.e. for generating pulses in sequence from left to right or from right to left. The upper part of FIG. 17 illustrates operation from left to right whereas the lower part illustrates operation from right to left. The stages 2 which are active for the inverted clock !CK may be arranged in the same way.

The stage 1 comprises first and second electronic changeover switches 6 and 7. The switches 6 and 7 are controlled by suitable single phase, or complementary control signals (not shown in FIG. 17 for the sake of clarity).

As shown in the upper part of FIG. 17, when the generator configured for left to right operation, the switch 6 connects the gating input G of the gating circuit and the clock input CK of the latch 3 to a terminal GR which receives the output signal Q of the preceding stage. The switch 7 connects the reset input R of the latch 3 to a terminal RG for receiving the output Q of the latch of the following stage as a reset signal. The stage thus operates as described hereinbefore.

When the generator is configured for right to left operation, the switches 6 and 7 are connected as shown in the lower part of FIG. 17. The gating input G of the gating circuit 4 and the clock input CK of the latch 3 are connected to the terminal RG and receive the output Q of the latch of the following stage. The reset input R of the latch 3 is connected to the terminal GR for receiving the output Q of the latch 3 of the preceding stage as a reset signal. Pulses at the outputs Q of the stages thus appear consecutively from right to left. For this mode of operation, the end connections of the first and Nth stages are exchanged so that the Nth stage receives the start pulse and the first stage resets itself.

The switches 6 and 7 may be embodied by transmission gates of the two transistor or single transistor type. A two transistor arrangement with complementary control inputs is described hereinafter.

Figure 18:
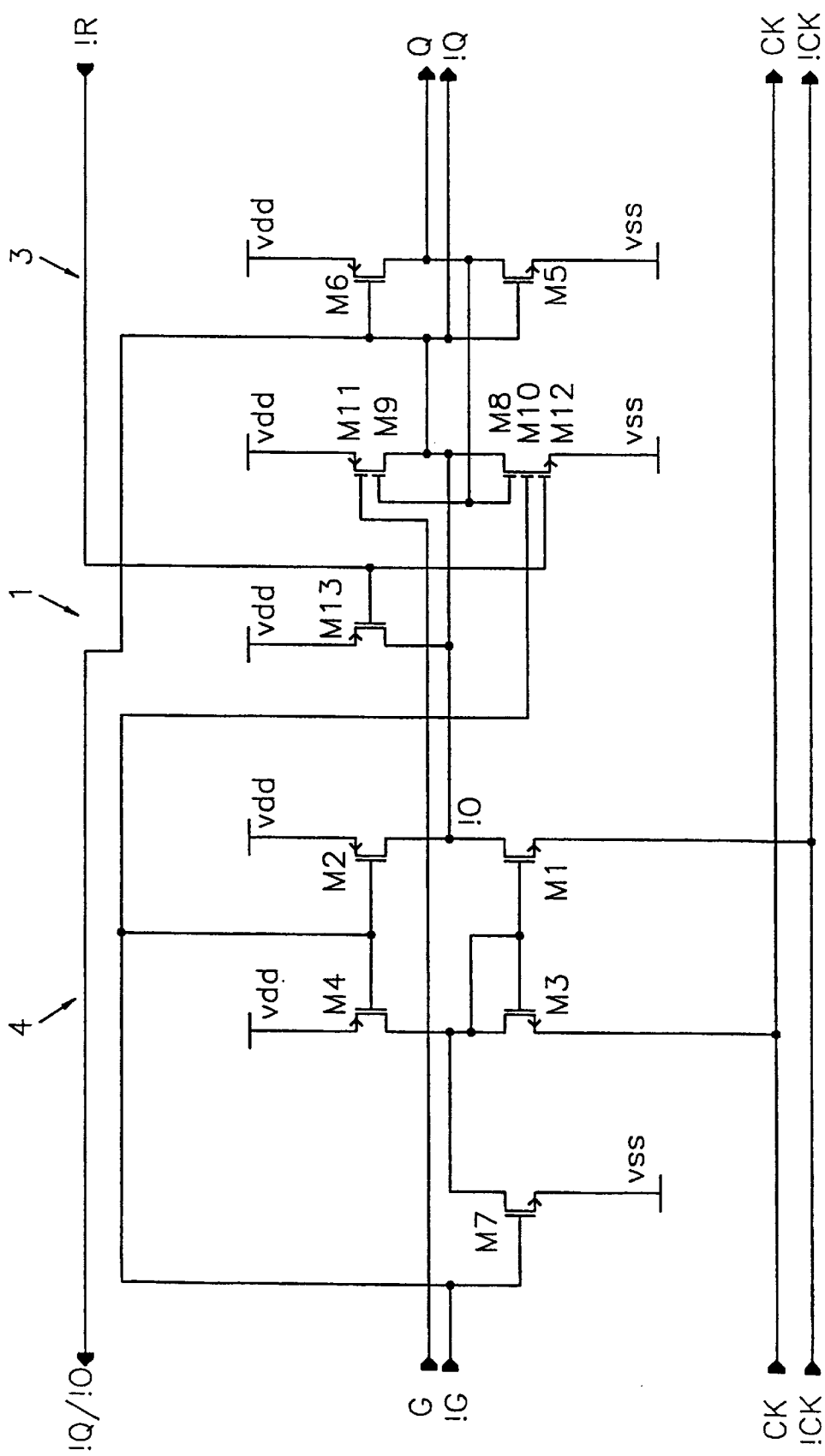
FIG. 18 is a circuit diagram of one stage of a state clock pulse generator constituting an embodiment of the invention.

FIG. 18 illustrates in detail an example of the stage 1 embodied by CMOS field effect transistors, for example in the form of poly-silicon thin film transistors. The alternate stages 2 may be embodied in the same way except that the connections to the complementary clock lines CK and !CK are exchanged. This arrangement is able to operate with input clock voltages which are substantially lower than the supply voltage because the gating circuit 4 provides a level shifting function for the higher input clock signal level. In this arrangement, the gating circuit output 10 and the latch reset input !R are "active low".

The gating circuit 4 comprises N-type transistors M1, M3 and M7 and P-type transistors M2 and M4. The sources of the transistors M1 and M3 are connected to the inverted and direct clock inputs ! CK and CK, respectively. The drain of the transistor M1 provides the output 10 of the gating circuit 4 and is connected to the drain of the transistor M2 whose source is connected to a first supply line vdd and whose gate is connected to the inverted gating input !G. The gate and drain of the transistor M3 are connected together and to the drains of the transistors M4 and M7. The source and gate of the transistor M4 are connected to the first supply line vdd and the inverted gating input !G, respectively. The source and gate of the transistor M7 are connected to a second supply line vss and the inverted input !G, respectively.

The D-type latch 3 comprises an N-type transistor M5, P-type transistors M6 and M13, a triple gate N-type transistor acting as series-connected single gate transistors M8, M10 and M12, and a dual gate P-type transistor acting as two series-connected single gate transistors M9 and M11. The transistors M5 and M6 form an inverter whose input is connected to the output 10 of the gating circuit 4 and whose output constitutes the direct output Q of the stage 1. The transistors M8–M12 form a gated feedback inverter whose input and output are connected to the output and input, respectively, of the inverter M5, M6.

The gate of the transistor M11 is connected to the direct gating input G whereas the gate of the transistor M10 is connected to the inverted input !G. thus, when the gating signal is active, the gated inverter is disabled whereas, when the gating input is inactive, the gated inverter is enabled and latches the output of the latch.

The transistor M13 comprises a pull-up transistor whose source and drain are connected to the first supply line vdd and the output 10 of the gating circuit 4, respectively. The gates of the transistor M13 and M12 are connected to the active low reset input !R of the latch 3.

Operation of the stage 1 shown in FIG. 18 is as follows. When the gating input is inactive so that the complementary gating signals G and !G are low and high, respectively, the transistors M2 and M4 are turned off and the pull-down transistor M7 ensures that the transistors M1 and M3 are turned off. The output !O of the gating circuit 4 is therefore in a high impedance state and is not affected by the clock signals CK and !CK. The output !O is thus held at the logic high level by the output of the gated inverter, which latches the state of the latch 3.

When the gating signal is active so that the signals G and !G are at high and low levels, respectively, the diode-connected transistor M3 acts as a bias voltage source with its load being provided by the transistor M4. The bias voltage is supplied to the gate of the transistor M1, which functions as a common gate amplifier with a load provided by the transistor M2 to provide a level-shifted version of the clock signal !CK at the gating circuit output !O. When the clock signal CK is low and the inverted clock signal !CK is high, the gate-source voltage of the transistor M1 is small and the transistor M2 holds the output 10 close to the positive supply voltage on the supply line vdd. Conversely, when the clock signals CK and !CK are high and low, respectively, the bias generated by the transistors M3 and M4 and supplied to the gate of the transistors M1 is larger. The gate-source voltage of the transistor M1 is increased sufficiently to allow the transistor M1 to pull the output !O close to ground potential on the supply line vss. For this purpose, the drive capability of the transistor M1 is substantially larger than that of the transistor M2.

Figure 1:
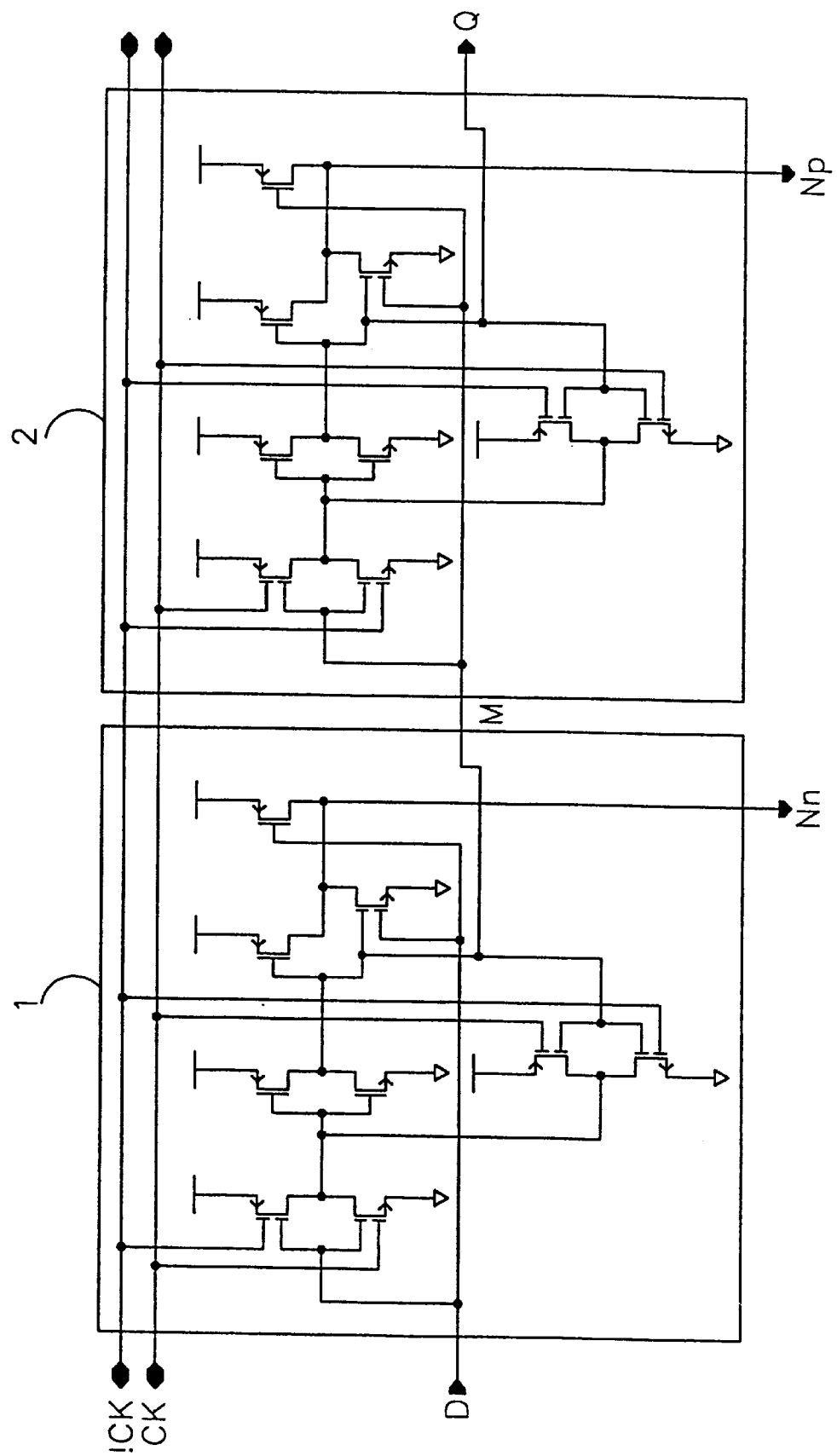
FIG. 1 is a circuit diagram of two stages of a known type of shift register.
Figure 2:
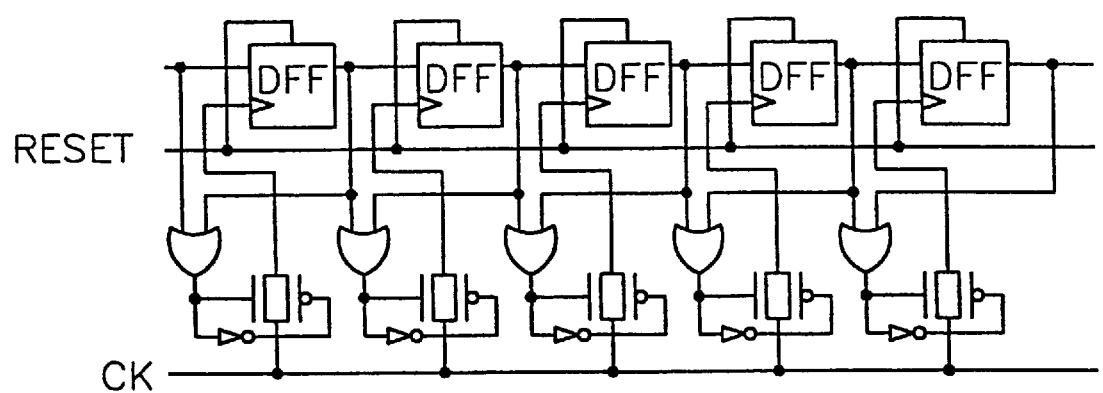
FIG. 2 is a block circuit diagram of a known type of clock pulse generator.

The D-type latch 3 with asynchronous reset is similar to a conventional clocked D-type latch as shown in FIG. 1 but with a first stage clocked inverter constituting part of the gating circuit 4 so that the output !O of the gating circuit is the same node as the complementary output !Q of the latch 3. The transistor M13 provides the asynchronous reset by pulling the node !Q high, so that the output Q goes low, and the transistor M12 prevents any transistor conflicts from occurring when resetting is taking place.

As described hereinbefore, when the gating input G is low, the latch mechanism of the latch 3 is activated so that the outputs Q and !Q remain latched at their current logic values. The latch thus determines the voltage at the gating circuit output !O because the gating circuit 4 is deactivated. However, the pull-up transistor M13 is still able to reset the latch.

Conversely, when the gating input G is high, the latch mechanism of the latch 3 is deactivated and the gating circuit 4 is activated. The gating circuit 4 thus determines the logic state of the output !O and hence the logic stage of the output Q of the latch 3.

Figure 19:
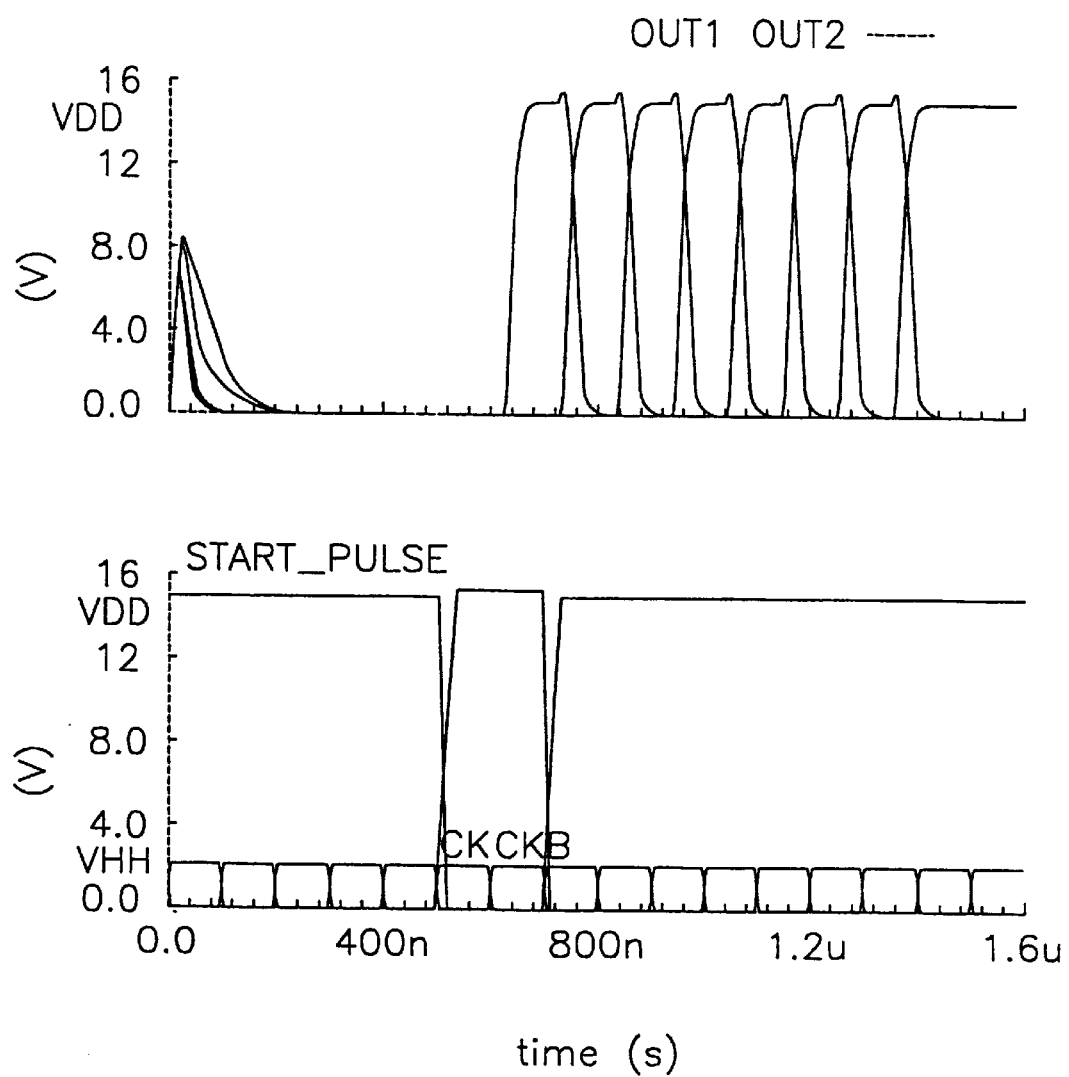
FIG. 19 is a waveform diagram illustrating waveforms occurring in a simulation of the clock pulse generator shown in FIG. 18.

The voltage waveforms illustrated in FIG. 19 are from a transient analysis simulation of a clock pulse generator comprising stages of the type shown in FIG. 18 with a supply voltage of 15 volts. The transistors were simulated with the performance of typical low-temperature polysilicon thin film transistors i.e. with threshold voltages of two volts and mutual conductances of 1.25 $\mu A/V^2$ for square devices. The clock inputs are complementary signals of two volt amplitude and 5 MHz frequency.

The lower waveform diagram of FIG. 19 illustrates the clock and start pulses whereas the upper diagram illustrates the output signals of consecutive stages of the clock pulse generator. Thus, following the start pulse, the clock pulse generator produces satisfactory output pulses whose amplitudes are substantially equal to the supply voltage. This is achieved with level shifting from the two volt clock pulses to the 15 volt output pulses.

Figure 20:
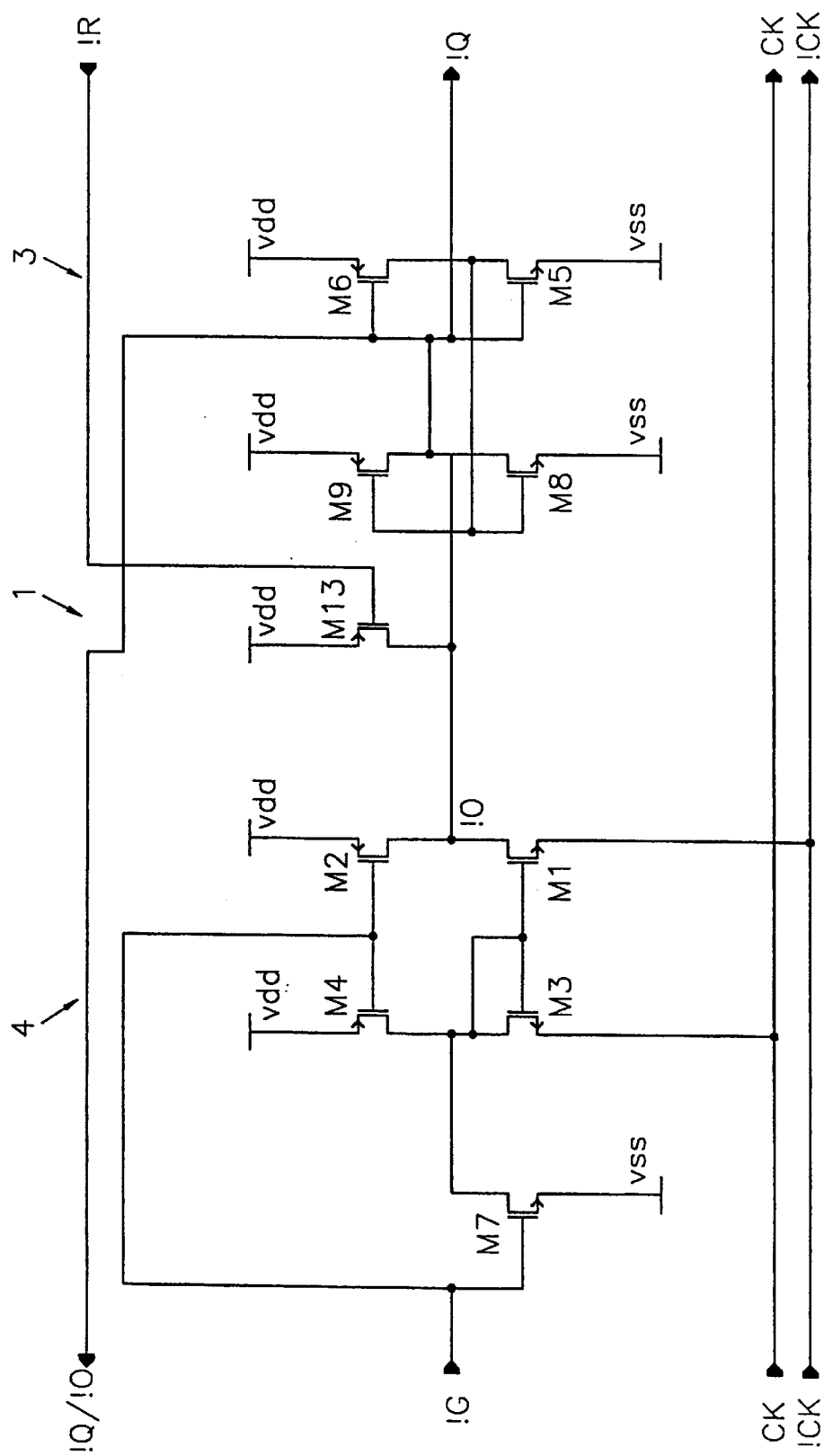
FIG. 20 is a circuit diagram of one stage of a static clock pulse generator constituting an embodiment of the invention.

FIG. 20 shows a clock pulse generator stage 1 which differs from that shown in FIG. 18 in that the feedback inverter is of the non-gated type i.e. the "transistors" M10, M11 and M12 are omitted. In order for this arrangement to function correctly, the transistors M8 and M9 must have a low drive capability in comparison with the transistors M1 and M13. However, this provides a simpler circuit arrangement and the direct gating input G may be omitted. Similarly, if not required to provide the stage output, the direct output Q may also be omitted.

Figure 21:
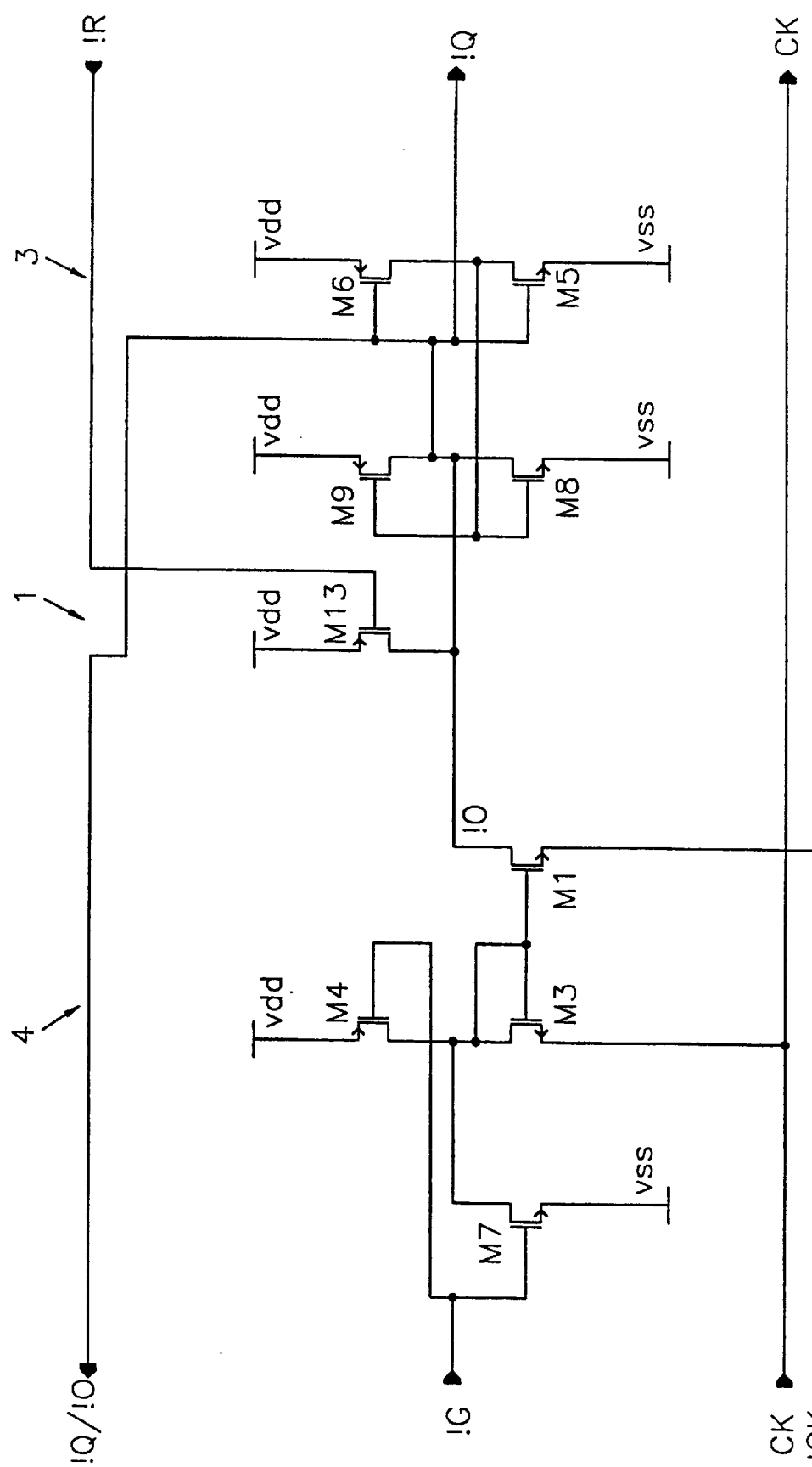
FIG. 21 is a circuit diagram of one stage of a static clock pulse generator constituting an embodiment of the invention.

FIG. 21 illustrates a simpler circuit arrangement in which the transistor M2 of the stage of FIG. 20 is omitted. During normal operation, the output !O of the gating circuit 4 is held high by the translator M9. However, when the gating circuit 4 is activated, the transistor M9 acts as the load for the transistor M1 and holds the output !O high until the rising edge of the direct clock pulse CK. The transistor M1 then pulls the output !O low and the transistor M13 pulls the output !O high approximately half a clock period later.

Figure 22:
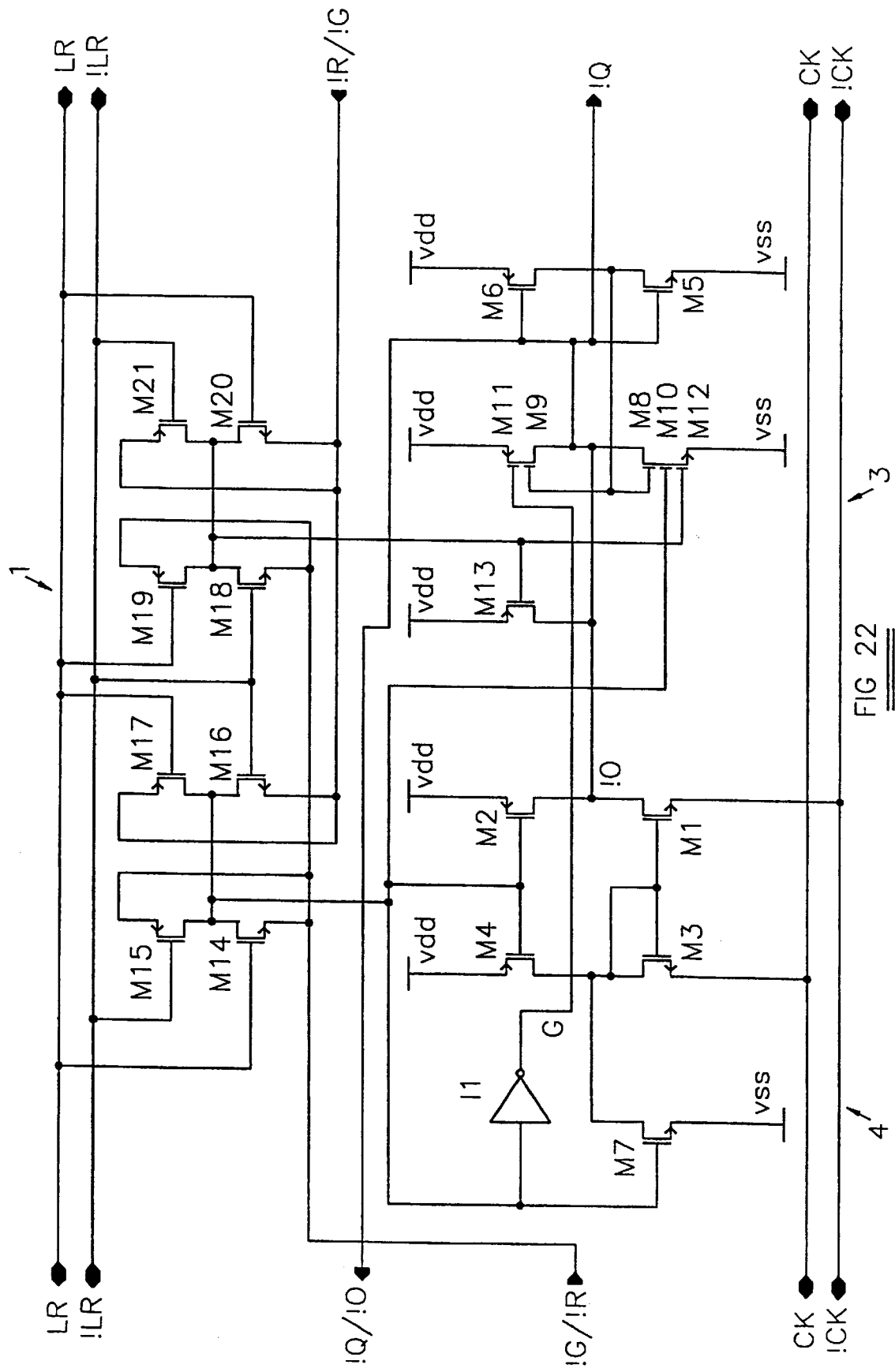
FIG. 22 is a circuit diagram of one stage of a bi-directional static clock pulse generator constituting an embodiment of the invention.

FIG. 22 illustrates a bi-directional embodiment of the stage illustrated in FIG. 18 with switching arrangements provided by transmission gates comprising transistors M14–M21. The control inputs of the transmission gates are connected to complementary left/right control lines LR and !LR so that, when left to right operation is required, the control signals LR and !LR are high and low, respectively, whereas, when right to left operation is required, the control signals LR and !LR are low and high, respectively. In order to avoid the need for separately switching a direct gating signal G for bi-directional operation, an inverter I1 generates the direct gating signal G from the inverted gating signal !G.

Figure 23:
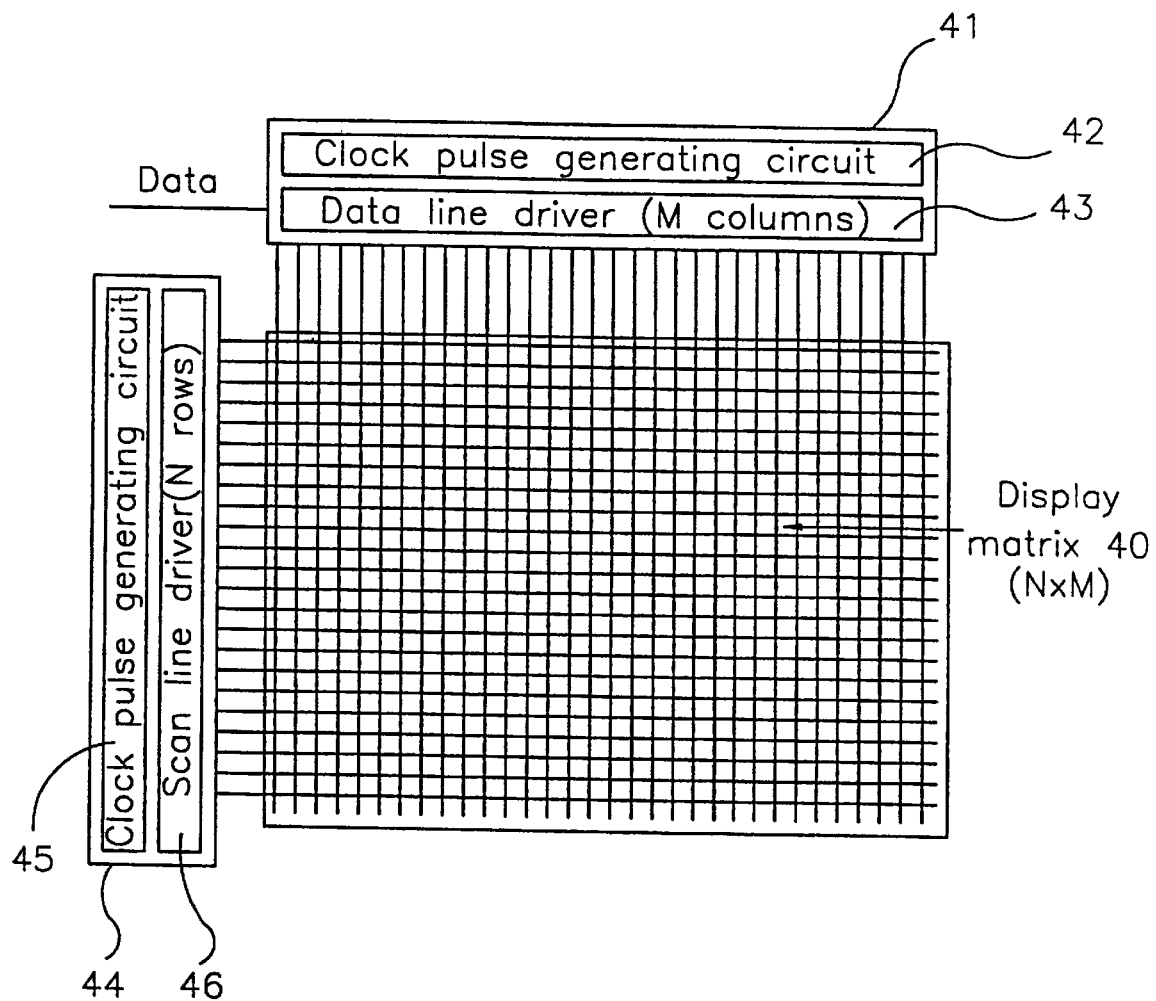
FIG. 23 is a block schematic diagram of a display comprising a liquid crystal spatial light modulator constituting an embodiment of the invention.

FIG. 23 illustrates a display comprising a display matrix 40 of N rows by M columns of pixels, for instance in the form of a spatial light modulator comprising a liquid crystal device. The display further comprises an address signal generator 41 comprising a clock pulse generating circuit 42 and a set of data line drivers 43. The clock pulse generating circuit 42 comprises a generator of any of the types described hereinbefore and illustrated in FIGS. 3 to 22. A scan signal generator 44 supplies scan signals to the rows of pixels and comprises a clock pulse generating circuit 45 and a set of line drivers 46. The clock pulse generating circuit 45 comprises a generator of any of the types described hereinbefore and illustrated in FIGS. 3 to 22. The clock pulse generating circuits generate clock pulses at pixel data rate for the circuit 42 and at line data rate for the circuit 45.

What is claimed is:

1. A static clock pulse generator comprising a main clock input and N stages, each ith one of which comprises: a D-type circuit having a reset input for receiving a reset signal from an (i+a)th stage, where a is greater than or equal to one, and a data input; and a gating circuit having an output for supplying a pulse to the data input in response to a D-type circuit output signal of an (i−1)th stage and a clock pulse at the main clock input, where $1<i\leq(N-a)$.

2. A generator as claimed in claim 1, in which each D-type circuit is a D-type latch.

3. A generator as claimed in claim 1, in which each of at least one of the stages has an output for supplying the D-type circuit output signal and constituting an output of the generator.

4. A generator as claimed in claim 1, in which the reset input of the D-type circuit of each ith stages is arranged to receive the reset signal from the output of the gating circuit of the (i+a)th stage.

5. A generator as claimed in claim 1, in which the reset input of the D-type circuit of each ith stage is arranged to receive the D-type circuit output signal of the (i+a)th stage as the reset signal.

6. A generator as claimed in claim 1, in which each stage comprises a delay circuit disposed between the gating circuit output and the D-type circuit data input of each stage.

7. A generator as claimed in claim 6, in which each delay circuit comprises a plurality of cascade-connected inverters.

8. A generator as claimed in claim 1, in which each stage comprises a switching arrangement for selectively connecting the D-type circuit reset input to receive the reset signal from the (i−a)th stage and causing the gating circuit to supply the pulse to the data input in response to the D-type circuit output signal of the (i+1)th stage and the clock pulse at the main clock input, where $(1+a)\leq 1<N$.

9. A generator as claimed in claim 8, in which each switching arrangement comprises a plurality of transmission gates.

10. A generator as claimed in claim 1, in which the D-type circuit of each ith stage comprises a clock input for receiving the D-type circuit output signal of the (i−1)th stage.

11. A generator as claimed in claim 8, in which the switching arrangement is arranged selectively to connect the D-type circuit clock input of each ith stage to receive the D-type circuit output signal of the (i+1)th stage.

12. A generator as claimed in claim 1, in which the first stage comprises: a D-type circuit having a reset input, for receiving a reset signal from a (1+a)th stage, and a data input; and a gating circuit for supplying a pulse to the D-type circuit data input in response to a start pulse and a clock pulse at the main clock input.

13. A generator as claimed in claim 8, in which the switching arrangement is arranged selectively to connect the reset signal from the first stage to the D-type circuit reset input of the first stage.

14. A generator as claimed in claim 1, in which the Nth stage comprises: a D-type circuit having a data input, an output and a reset input for receiving a reset signal from the D-type circuit output; and a gating circuit having an output for supplying a pulse to the data input in response to the D-type circuit output signal of the (N−1)th stage and a clock pulse at the main clock input.

15. A generator as claimed in claim 1, in which the main clock input comprises a complementary clock input and the gating circuits of consecutive pairs of stages are arranged to respond to complementary clock pulses at the complementary inputs.

16. A generator as claimed in claim 1 in which each gating circuit comprises a first transistor whose common electrode is connected to the main clock input, whose output electrode forms an enabled data input of the D-type circuit and whose control electrode is responsive to the D-type circuit output signal of the preceding stage.

17. A generator as claimed in claim 16, in which each gating circuit comprises a second transistor whose common electrode is connected to a first supply line and whose output electrode is connected to the output electrode of the first transistor.

18. A generator as claimed in claim 17, in which the control electrode of the second transistor is arranged to receive the D-type circuit output signal of the preceding stage.

19. A generator as claimed in claim 16, in which the control electrode of the first transistor is connected to a bias voltage source which is arranged to be controlled by the D-type circuit output signal of the preceding stage.

20. A generator as claimed in claim 19, in which the bias voltage source comprises a third transistor whose common electrode to connected to an inverted main clock input and whose control and output electrodes are connected to the control electrode of the first transistor.

21. A generator as claimed in claim 20, in which the control electrode of the first transistor is connected to the output electrode of a fourth transistor whose common electrode is connected to a or the first supply line.

22. A generator as claimed in claim 21, in which the control electrode of the fourth transistor is arranged to receive the D-type circuit output signal of the preceding stage.

23. A generator as claimed in claim 16, in which the control electrode of the first transistor is connected to the output electrode of a fifth transistor whose common electrode is connected to a second supply line and whose control electrode is arranged to receive the D-type circuit output signal of the preceding stage.

24. A generator as claimed in claim 2, in which each D-type latch comprises a first inverter and a second feedback inverter.

25. A generator as claimed in claim 24, in which the second inverter is a gated inverter having a gate input arranged to be controlled by the D-type latch output signal of the preceding stage.

26. A generator as claimed in claim 24, in which the first inverter is connected to a pull-up or pull-down transistor whose control terminal comprises the reset input.

27. A generator as claimed in claim 1, formed as CMOS integrated circuit.

28. A generator as claimed in claim 1, formed of polysilicon thin film transistors.

29. A spatial light modulator comprising a generator as claimed in claim 1.

30. A modulator as claimed in claim 29, comprising a liquid crystal device.

31. A modulator as claimed in claim 30, in which the liquid crystal device is of passive matrix type.

32. A modulator as claimed in claim 30, in which the liquid crystal device is of active matrix type.

33. A modulator as claimed in claim 32, in which the generator and the active matrix are formed of thin film transistors of the same type.

34. A display comprising a modulator as claimed in claim 29.

35. A light-emissive display comprising a generator as claimed in claim 1.

36. A display as claimed in claim 35 of passive matrix type.

37. A display as claimed in claim 35 of active matrix type.

* * * * *